US010163996B2

(12) United States Patent
Striakhilev et al.

(10) Patent No.: US 10,163,996 B2
(45) Date of Patent: Dec. 25, 2018

(54) PIXEL HAVING AN ORGANIC LIGHT EMITTING DIODE AND METHOD OF FABRICATING THE PIXEL

(71) Applicant: Ignis Innovation Inc., Waterloo (CA)

(72) Inventors: Denis Striakhilev, Waterloo (CA); Arokia Nathan, Cambridge (GB); Yuri Vygranenko, Waterloo (CA); Sheng Tao, Waterloo (CA)

(73) Assignee: Ignis Innovation Inc., Waterloo (CA)

( * ) Notice: Subject to any disclaimer, the term of this patent is extended or adjusted under 35 U.S.C. 154(b) by 0 days.

(21) Appl. No.: 15/403,313

(22) Filed: Jan. 11, 2017

(65) Prior Publication Data
US 2017/0125498 A1    May 4, 2017

Related U.S. Application Data

(63) Continuation of application No. 13/112,654, filed on May 20, 2011, which is a continuation of application
(Continued)

(30) Foreign Application Priority Data

Feb. 24, 2003 (CA) .................................. 2419704

(51) Int. Cl.
*H01L 27/32* (2006.01)
*H01L 51/52* (2006.01)
(Continued)

(52) U.S. Cl.
CPC ...... *H01L 27/3248* (2013.01); *H01L 27/3246* (2013.01); *H01L 27/3258* (2013.01);
(Continued)

(58) Field of Classification Search
CPC ............ H01L 27/3272; H01L 27/3248; H01L 51/5234; H01L 27/124
(Continued)

(56) References Cited

U.S. PATENT DOCUMENTS 4,354,162 A    10/1982   Wright
4,758,831 A     7/1988   Kasahara et al.
(Continued)

FOREIGN PATENT DOCUMENTS

CA    1294034    1/1992
CA    2109951    11/1992
(Continued)

OTHER PUBLICATIONS

Ahnood et al.: "Effect of threshold voltage instability on field effect mobility in thin film transistors deduced from constant current measurements"; dated Aug. 2009 (3 pages).
(Continued)

*Primary Examiner* — Karabi Guharay
(74) *Attorney, Agent, or Firm* — Stratford Managers Corporation

(57) ABSTRACT

A pixel having an organic light emitting diode (OLED) and method for fabricating the pixel is provided. A planarization dielectric layer is provided between a thin-film transistor (TFT) based backplane and OLED layers. A through via between the TFT backplane and the OLED layers forms a sidewall angle of less than 90 degrees to the TFT backplane. The via area and edges of an OLED bottom electrode pattern may be covered with a dielectric cap.

21 Claims, 13 Drawing Sheets

Related U.S. Application Data

No. 10/546,695, filed as application No. PCT/CA2004/000256 on Feb. 24, 2004, now Pat. No. 7,948,170.

(51) Int. Cl.
*H01L 51/56* (2006.01)
*H01L 27/12* (2006.01)

(52) U.S. Cl.
CPC ...... *H01L 27/3262* (2013.01); *H01L 27/3272* (2013.01); *H01L 27/3276* (2013.01); *H01L 51/5234* (2013.01); *H01L 51/56* (2013.01); H01L 27/124 (2013.01); H01L 27/1248 (2013.01); H01L 2227/323 (2013.01); H01L 2251/5315 (2013.01)

(58) Field of Classification Search
USPC .................................. 313/504, 506, 512
See application file for complete search history.

(56) References Cited

U.S. PATENT DOCUMENTS

| | | | |
|---|---|---|---|
| 4,963,860 | A | 10/1990 | Stewart |
| 4,975,691 | A | 12/1990 | Lee |
| 4,996,523 | A | 2/1991 | Bell et al. |
| 5,051,739 | A | 9/1991 | Hayashida et al. |
| 5,222,082 | A | 6/1993 | Plus |
| 5,266,515 | A | 11/1993 | Robb et al. |
| 5,498,880 | A | 3/1996 | Lee et al. |
| 5,589,847 | A | 12/1996 | Lewis |
| 5,619,033 | A | 4/1997 | Weisfield |
| 5,648,276 | A | 7/1997 | Hara et al. |
| 5,670,973 | A | 9/1997 | Bassetti et al. |
| 5,684,365 | A | 11/1997 | Tang et al. |
| 5,686,935 | A | 11/1997 | Weisbrod |
| 5,712,653 | A | 1/1998 | Katoh et al. |
| 5,714,968 | A | 2/1998 | Ikeda |
| 5,747,928 | A | 5/1998 | Shanks et al. |
| 5,748,160 | A | 5/1998 | Shieh et al. |
| 5,784,042 | A | 7/1998 | Ono et al. |
| 5,790,234 | A | 8/1998 | Matsuyama |
| 5,815,303 | A | 9/1998 | Berlin |
| 5,870,071 | A | 2/1999 | Kawahata |
| 5,874,803 | A | 2/1999 | Garbuzov et al. |
| 5,880,582 | A | 3/1999 | Sawada |
| 5,903,248 | A | 5/1999 | Irwin |
| 5,917,280 | A | 6/1999 | Burrows et al. |
| 5,923,794 | A | 7/1999 | McGrath et al. |
| 5,952,789 | A | 9/1999 | Stewart et al. |
| 5,990,629 | A | 11/1999 | Yamada et al. |
| 6,023,259 | A | 2/2000 | Howard et al. |
| 6,069,365 | A | 5/2000 | Chow et al. |
| 6,081,131 | A | 6/2000 | Ishii |
| 6,091,203 | A | 7/2000 | Kawashima et al. |
| 6,097,360 | A | 8/2000 | Holloman |
| 6,144,222 | A | 11/2000 | Ho |
| 6,157,583 | A | 12/2000 | Starnes et al. |
| 6,166,489 | A | 12/2000 | Thompson et al. |
| 6,177,915 | B1 | 1/2001 | Beeteson et al. |
| 6,225,846 | B1 | 5/2001 | Wada et al. |
| 6,229,508 | B1 | 5/2001 | Kane |
| 6,232,939 | B1 | 5/2001 | Saito et al. |
| 6,246,180 | B1 | 6/2001 | Nishigaki |
| 6,252,248 | B1 | 6/2001 | Sano et al. |
| 6,259,424 | B1 | 7/2001 | Kurogane |
| 6,274,887 | B1 | 8/2001 | Yamazaki et al. |
| 6,288,696 | B1 | 9/2001 | Holloman |
| 6,300,928 | B1 | 10/2001 | Kim |
| 6,303,963 | B1 | 10/2001 | Ohtani et al. |
| 6,306,694 | B1 | 10/2001 | Yamazaki et al. |
| 6,307,322 | B1 | 10/2001 | Dawson et al. |
| 6,316,786 | B1 | 11/2001 | Mueller et al. |
| 6,320,325 | B1 | 11/2001 | Cok et al. |
| 6,323,631 | B1 | 11/2001 | Juang |
| 6,323,832 | B1 | 11/2001 | Nishizawa et al. |
| 6,345,085 | B1 | 2/2002 | Yeo et al. |
| 6,348,835 | B1 | 2/2002 | Sato et al. |
| 6,365,917 | B1 | 4/2002 | Yamazaki |
| 6,373,453 | B1 | 4/2002 | Yudasaka |
| 6,384,427 | B1 | 5/2002 | Yamazaki et al. |
| 6,392,617 | B1 | 5/2002 | Gleason |
| 6,399,988 | B1 | 6/2002 | Yamazaki |
| 6,414,661 | B1 | 7/2002 | Shen et al. |
| 6,420,758 | B1 | 7/2002 | Nakajima |
| 6,420,834 | B2 | 7/2002 | Yamazaki et al. |
| 6,420,988 | B1 | 7/2002 | Azami et al. |
| 6,433,488 | B1 | 8/2002 | Bu |
| 6,445,376 | B2 | 9/2002 | Parrish |
| 6,468,638 | B2 | 10/2002 | Jacobsen et al. |
| 6,489,952 | B1 | 12/2002 | Tanaka et al. |
| 6,501,098 | B2 | 12/2002 | Yamazaki |
| 6,501,466 | B1 | 12/2002 | Yamagashi et al. |
| 6,512,271 | B1 | 1/2003 | Yamazaki et al. |
| 6,518,594 | B1 | 2/2003 | Nakajima et al. |
| 6,524,895 | B2 | 2/2003 | Yamazaki et al. |
| 6,531,713 | B1 | 3/2003 | Yamazaki |
| 6,559,594 | B2 | 5/2003 | Fukunaga et al. |
| 6,573,195 | B1 | 6/2003 | Yamazaki et al. |
| 6,573,584 | B1 | 6/2003 | Nagakari et al. |
| 6,576,926 | B1 | 6/2003 | Yamazaki et al. |
| 6,577,302 | B2 | 6/2003 | Hunter |
| 6,580,408 | B1 | 6/2003 | Bae et al. |
| 6,580,657 | B2 | 6/2003 | Sanford et al. |
| 6,583,775 | B1 | 6/2003 | Sekiya et al. |
| 6,583,776 | B2 | 6/2003 | Yamazaki et al. |
| 6,587,086 | B1 | 7/2003 | Koyama |
| 6,593,691 | B2 | 7/2003 | Nishi et al. |
| 6,594,606 | B2 | 7/2003 | Everitt |
| 6,597,203 | B2 | 7/2003 | Forbes |
| 6,611,108 | B2 | 8/2003 | Kimura |
| 6,617,644 | B1 | 9/2003 | Yamazaki et al. |
| 6,618,030 | B2 | 9/2003 | Kane et al. |
| 6,641,933 | B1 | 11/2003 | Yamazaki et al. |
| 6,661,180 | B2 | 12/2003 | Koyama |
| 6,661,397 | B2 | 12/2003 | Mikami et al. |
| 6,670,637 | B2 | 12/2003 | Yamazaki et al. |
| 6,677,713 | B1 | 1/2004 | Sung |
| 6,680,577 | B1 | 1/2004 | Inukai et al. |
| 6,687,266 | B1 | 2/2004 | Ma et al. |
| 6,690,344 | B1 | 2/2004 | Takeuchi et al. |
| 6,693,388 | B2 | 2/2004 | Oomura |
| 6,693,610 | B2 | 2/2004 | Shannon et al. |
| 6,697,057 | B2 | 2/2004 | Koyama et al. |
| 6,720,942 | B2 | 4/2004 | Lee et al. |
| 6,734,636 | B2 | 5/2004 | Sanford et al. |
| 6,738,034 | B2 | 5/2004 | Kaneko et al. |
| 6,738,035 | B1 | 5/2004 | Fan |
| 6,771,028 | B1 | 8/2004 | Winters |
| 6,777,712 | B2 | 8/2004 | Sanford et al. |
| 6,780,687 | B2 | 8/2004 | Nakajima et al. |
| 6,806,638 | B2 | 10/2004 | Lih et al. |
| 6,806,857 | B2 | 10/2004 | Sempel et al. |
| 6,809,706 | B2 | 10/2004 | Shimoda |
| 6,859,193 | B1 | 2/2005 | Yumoto |
| 6,861,670 | B1 | 3/2005 | Ohtani et al. |
| 6,873,117 | B2 | 3/2005 | Ishizuka |
| 6,873,320 | B2 | 3/2005 | Nakamura |
| 6,878,968 | B1 | 4/2005 | Ohnuma |
| 6,909,114 | B1 | 6/2005 | Yamazaki |
| 6,909,419 | B2 | 6/2005 | Zavracky et al. |
| 6,919,871 | B2 | 7/2005 | Kwon |
| 6,937,215 | B2 | 8/2005 | Lo |
| 6,940,214 | B1 | 9/2005 | Komiya et al. |
| 6,943,500 | B2 | 9/2005 | LeChevalier |
| 6,954,194 | B2 | 10/2005 | Matsumoto et al. |
| 6,956,547 | B2 | 10/2005 | Bae et al. |
| 6,995,510 | B2 | 2/2006 | Murakami et al. |
| 6,995,519 | B2 | 2/2006 | Arnold et al. |
| 7,022,556 | B1 | 4/2006 | Adachi |
| 7,023,408 | B2 | 4/2006 | Chen et al. |
| 7,027,015 | B2 | 4/2006 | Booth, Jr. et al. |
| 7,034,793 | B2 | 4/2006 | Sekiya et al. |

(56) References Cited

U.S. PATENT DOCUMENTS

| | | |
|---|---|---|
| 7,088,051 B1 | 8/2006 | Cok |
| 7,106,285 B2 | 9/2006 | Naugler |
| 7,116,058 B2 | 10/2006 | Lo et al. |
| 7,129,914 B2 | 10/2006 | Knapp et al. |
| 7,129,917 B2 | 10/2006 | Yamazaki et al. |
| 7,141,821 B1 | 11/2006 | Yamazaki et al. |
| 7,161,566 B2 | 1/2007 | Cok et al. |
| 7,193,589 B2 | 3/2007 | Yoshida et al. |
| 7,199,516 B2 | 4/2007 | Seo et al. |
| 7,220,997 B2 | 5/2007 | Nakata |
| 7,235,810 B1 | 6/2007 | Yamazaki et al. |
| 7,245,277 B2 | 7/2007 | Ishizuka |
| 7,248,236 B2 | 7/2007 | Nathan et al. |
| 7,264,979 B2 | 9/2007 | Yamagata et al. |
| 7,274,345 B2 | 9/2007 | Imamura et al. |
| 7,274,363 B2 | 9/2007 | Ishizuka et al. |
| 7,279,711 B1 | 10/2007 | Yamazaki et al. |
| 7,304,621 B2 | 12/2007 | Oomori et al. |
| 7,310,092 B2 | 12/2007 | Imamura |
| 7,315,295 B2 | 1/2008 | Kimura |
| 7,317,429 B2 | 1/2008 | Shirasaki et al. |
| 7,319,465 B2 | 1/2008 | Mikami et al. |
| 7,321,348 B2 | 1/2008 | Cok et al. |
| 7,339,636 B2 | 3/2008 | Voloschenko et al. |
| 7,355,574 B1 | 4/2008 | Leon et al. |
| 7,358,941 B2 | 4/2008 | Ono et al. |
| 7,402,467 B1 | 7/2008 | Kadono et al. |
| 7,414,600 B2 | 8/2008 | Nathan et al. |
| 7,432,885 B2 | 10/2008 | Asano et al. |
| 7,474,285 B2 | 1/2009 | Kimura |
| 7,485,478 B2 | 2/2009 | Yamagata et al. |
| 7,502,000 B2 | 3/2009 | Yuki et al. |
| 7,535,449 B2 | 5/2009 | Miyazawa |
| 7,554,512 B2 | 6/2009 | Steer |
| 7,569,849 B2 | 8/2009 | Nathan et al. |
| 7,619,594 B2 | 11/2009 | Hu |
| 7,619,597 B2 | 11/2009 | Nathan et al. |
| 7,697,052 B1 | 4/2010 | Yamazaki et al. |
| 7,825,419 B2 | 11/2010 | Yamagata et al. |
| 7,859,492 B2 | 12/2010 | Kohno |
| 7,868,859 B2 | 1/2011 | Tomida et al. |
| 7,876,294 B2 | 1/2011 | Sasaki et al. |
| 7,948,170 B2 | 5/2011 | Striakhilev et al. |
| 7,969,390 B2 | 6/2011 | Yoshida |
| 7,995,010 B2 | 8/2011 | Yamazaki et al. |
| 8,044,893 B2 | 10/2011 | Nathan et al. |
| 8,115,707 B2 | 2/2012 | Nathan et al. |
| 8,378,362 B2 | 2/2013 | Heo et al. |
| 8,493,295 B2 | 7/2013 | Yamazaki et al. |
| 8,497,525 B2 | 7/2013 | Yamagata et al. |
| 2001/0002703 A1 | 6/2001 | Koyama |
| 2001/0004190 A1 | 6/2001 | Nishi et al. |
| 2001/0013806 A1 | 8/2001 | Notani |
| 2001/0015653 A1 | 8/2001 | De Jong et al. |
| 2001/0020926 A1 | 9/2001 | Kujik |
| 2001/0024186 A1 | 9/2001 | Kane |
| 2001/0026127 A1 | 10/2001 | Yoneda et al. |
| 2001/0026179 A1 | 10/2001 | Saeki |
| 2001/0026257 A1 | 10/2001 | Kimura |
| 2001/0030323 A1 | 10/2001 | Ikeda |
| 2001/0033199 A1 | 10/2001 | Aoki |
| 2001/0038098 A1 | 11/2001 | Yamazaki et al. |
| 2001/0043173 A1 | 11/2001 | Troutman |
| 2001/0045929 A1 | 11/2001 | Prache et al. |
| 2001/0052606 A1 | 12/2001 | Sempel et al. |
| 2001/0052898 A1 | 12/2001 | Osame et al. |
| 2002/0000576 A1 | 1/2002 | Inukai |
| 2002/0011796 A1 | 1/2002 | Koyama |
| 2002/0011799 A1 | 1/2002 | Kimura |
| 2002/0011981 A1 | 1/2002 | Kujik |
| 2002/0015031 A1 | 2/2002 | Fujita et al. |
| 2002/0015032 A1 | 2/2002 | Koyama et al. |
| 2002/0030528 A1 | 3/2002 | Matsumoto et al. |
| 2002/0030647 A1 | 3/2002 | Hack et al. |
| 2002/0036463 A1 | 3/2002 | Yoneda et al. |
| 2002/0047852 A1 | 4/2002 | Inukai et al. |
| 2002/0048829 A1 | 4/2002 | Yamazaki et al. |
| 2002/0050795 A1 | 5/2002 | Imura |
| 2002/0053401 A1 | 5/2002 | Ishikawa et al. |
| 2002/0070909 A1 | 6/2002 | Asano et al. |
| 2002/0080108 A1 | 6/2002 | Wang |
| 2002/0084463 A1 | 7/2002 | Sanford et al. |
| 2002/0101172 A1 | 8/2002 | Bu |
| 2002/0101433 A1 | 8/2002 | McKnight |
| 2002/0113248 A1 | 8/2002 | Yamagata et al. |
| 2002/0122308 A1 | 9/2002 | Ikeda |
| 2002/0130686 A1 | 9/2002 | Forbes |
| 2002/0154084 A1 | 10/2002 | Tanaka et al. |
| 2002/0158823 A1 | 10/2002 | Zavracky et al. |
| 2002/0163314 A1 | 11/2002 | Yamazaki et al. |
| 2002/0167471 A1 | 11/2002 | Everitt |
| 2002/0180369 A1 | 12/2002 | Koyama |
| 2002/0180721 A1 | 12/2002 | Kimura et al. |
| 2002/0186214 A1 | 12/2002 | Siwinski |
| 2002/0190332 A1 | 12/2002 | Lee et al. |
| 2002/0190924 A1 | 12/2002 | Asano et al. |
| 2002/0190971 A1 | 12/2002 | Nakamura et al. |
| 2002/0195967 A1 | 12/2002 | Kim et al. |
| 2002/0195968 A1 | 12/2002 | Sanford et al. |
| 2003/0020413 A1 | 1/2003 | Oomura |
| 2003/0030603 A1 | 2/2003 | Shimoda |
| 2003/0062524 A1 | 4/2003 | Kimura |
| 2003/0063081 A1 | 4/2003 | Kimura et al. |
| 2003/0071804 A1 | 4/2003 | Yamazaki et al. |
| 2003/0071821 A1 | 4/2003 | Sundahl |
| 2003/0076048 A1 | 4/2003 | Rutherford |
| 2003/0090445 A1 | 5/2003 | Chen et al. |
| 2003/0090447 A1 | 5/2003 | Kimura |
| 2003/0090481 A1 | 5/2003 | Kimura |
| 2003/0095087 A1 | 5/2003 | Libsch |
| 2003/0107560 A1 | 6/2003 | Yumoto et al. |
| 2003/0111966 A1 | 6/2003 | Mikami et al. |
| 2003/0122745 A1 | 7/2003 | Miyazawa |
| 2003/0140958 A1 | 7/2003 | Yang et al. |
| 2003/0146693 A1* | 8/2003 | Ishihara ............. H01L 27/3276 313/504 |
| 2003/0151569 A1 | 8/2003 | Lee et al. |
| 2003/0169219 A1 | 9/2003 | LeChevalier |
| 2003/0174152 A1 | 9/2003 | Noguchi |
| 2003/0178617 A1 | 9/2003 | Appenzeller et al. |
| 2003/0179626 A1 | 9/2003 | Sanford et al. |
| 2003/0197663 A1 | 10/2003 | Lee et al. |
| 2003/0206060 A1 | 11/2003 | Suzuki |
| 2003/0230980 A1 | 12/2003 | Forrest et al. |
| 2004/0027063 A1 | 2/2004 | Nishikawa |
| 2004/0056604 A1 | 3/2004 | Shih et al. |
| 2004/0066357 A1 | 4/2004 | Kawasaki |
| 2004/0070557 A1 | 4/2004 | Asano et al. |
| 2004/0080262 A1 | 4/2004 | Park et al. |
| 2004/0080470 A1 | 4/2004 | Yamazaki et al. |
| 2004/0090400 A1 | 5/2004 | Yoo |
| 2004/0108518 A1 | 6/2004 | Jo |
| 2004/0113903 A1 | 6/2004 | Mikami et al. |
| 2004/0129933 A1 | 7/2004 | Nathan et al. |
| 2004/0130516 A1 | 7/2004 | Nathan et al. |
| 2004/0135749 A1 | 7/2004 | Kondakov et al. |
| 2004/0145547 A1 | 7/2004 | Oh |
| 2004/0150592 A1 | 8/2004 | Mizukoshi et al. |
| 2004/0150594 A1 | 8/2004 | Koyama et al. |
| 2004/0150595 A1 | 8/2004 | Kasai |
| 2004/0155841 A1 | 8/2004 | Kasai |
| 2004/0174347 A1 | 9/2004 | Sun et al. |
| 2004/0174349 A1 | 9/2004 | Libsch |
| 2004/0183759 A1 | 9/2004 | Stevenson et al. |
| 2004/0189627 A1 | 9/2004 | Shirasaki et al. |
| 2004/0196275 A1 | 10/2004 | Hattori |
| 2004/0201554 A1 | 10/2004 | Satoh |
| 2004/0207615 A1 | 10/2004 | Yumoto |
| 2004/0233125 A1 | 11/2004 | Tanghe et al. |
| 2004/0239596 A1 | 12/2004 | Ono et al. |
| 2004/0252089 A1 | 12/2004 | Ono et al. |
| 2004/0257355 A1 | 12/2004 | Naugler |
| 2004/0263437 A1 | 12/2004 | Hattori |
| 2005/0007357 A1 | 1/2005 | Yamashita et al. |

(56) References Cited

U.S. PATENT DOCUMENTS

| | | |
|---|---|---|
| 2005/0030267 A1 | 2/2005 | Tanghe et al. |
| 2005/0035709 A1 | 2/2005 | Furuie et al. |
| 2005/0067970 A1 | 3/2005 | Libsch et al. |
| 2005/0067971 A1 | 3/2005 | Kane |
| 2005/0068270 A1 | 3/2005 | Awakura |
| 2005/0088085 A1 | 4/2005 | Nishikawa et al. |
| 2005/0088103 A1 | 4/2005 | Kageyama et al. |
| 2005/0110420 A1 | 5/2005 | Arnold et al. |
| 2005/0117096 A1 | 6/2005 | Voloschenko et al. |
| 2005/0140598 A1 | 6/2005 | Kim et al. |
| 2005/0140610 A1 | 6/2005 | Smith et al. |
| 2005/0145891 A1 | 7/2005 | Abe |
| 2005/0156831 A1 | 7/2005 | Yamazaki et al. |
| 2005/0168416 A1 | 8/2005 | Hashimoto et al. |
| 2005/0206590 A1 | 9/2005 | Sasaki et al. |
| 2005/0225686 A1 | 10/2005 | Brummack et al. |
| 2005/0260777 A1 | 11/2005 | Brabec et al. |
| 2005/0269959 A1 | 12/2005 | Uchino et al. |
| 2005/0269960 A1 | 12/2005 | Ono et al. |
| 2005/0285822 A1 | 12/2005 | Reddy et al. |
| 2005/0285825 A1 | 12/2005 | Eom et al. |
| 2006/0007072 A1 | 1/2006 | Choi et al. |
| 2006/0012310 A1 | 1/2006 | Chen et al. |
| 2006/0027807 A1 | 2/2006 | Nathan et al. |
| 2006/0030084 A1 | 2/2006 | Young |
| 2006/0038758 A1 | 2/2006 | Routley et al. |
| 2006/0044227 A1 | 3/2006 | Hadcock |
| 2006/0066527 A1 | 3/2006 | Chou |
| 2006/0092185 A1 | 5/2006 | Jo et al. |
| 2006/0232522 A1 | 10/2006 | Roy et al. |
| 2006/0261841 A1 | 11/2006 | Fish |
| 2006/0264143 A1 | 11/2006 | Lee et al. |
| 2006/0273997 A1 | 12/2006 | Nathan et al. |
| 2006/0284801 A1 | 12/2006 | Yoon et al. |
| 2007/0001937 A1 | 1/2007 | Park et al. |
| 2007/0001939 A1 | 1/2007 | Hashimoto et al. |
| 2007/0008268 A1 | 1/2007 | Park et al. |
| 2007/0008297 A1 | 1/2007 | Bassetti |
| 2007/0046195 A1 | 3/2007 | Chin et al. |
| 2007/0069998 A1 | 3/2007 | Naugler et al. |
| 2007/0080905 A1 | 4/2007 | Takahara |
| 2007/0080906 A1 | 4/2007 | Tanabe |
| 2007/0080908 A1 | 4/2007 | Nathan et al. |
| 2007/0080918 A1 | 4/2007 | Kawachi et al. |
| 2007/0103419 A1 | 5/2007 | Uchino et al. |
| 2007/0182671 A1 | 8/2007 | Nathan et al. |
| 2007/0273294 A1 | 11/2007 | Nagayama |
| 2007/0285359 A1 | 12/2007 | Ono |
| 2007/0296672 A1 | 12/2007 | Kim et al. |
| 2008/0042948 A1 | 2/2008 | Yamashita et al. |
| 2008/0055209 A1 | 3/2008 | Cok |
| 2008/0074413 A1 | 3/2008 | Ogura |
| 2008/0088549 A1 | 4/2008 | Nathan et al. |
| 2008/0122803 A1 | 5/2008 | Izadi et al. |
| 2008/0230118 A1 | 9/2008 | Nakatani et al. |
| 2009/0032807 A1 | 2/2009 | Shinohara et al. |
| 2009/0051283 A1 | 2/2009 | Cok et al. |
| 2009/0160743 A1 | 6/2009 | Tomida et al. |
| 2009/0162961 A1 | 6/2009 | Deane |
| 2009/0174628 A1 | 7/2009 | Wang et al. |
| 2009/0213046 A1 | 8/2009 | Nam |
| 2010/0052524 A1 | 3/2010 | Kinoshita |
| 2010/0078230 A1 | 4/2010 | Rosenblatt et al. |
| 2010/0079711 A1 | 4/2010 | Tanaka |
| 2010/0097335 A1 | 4/2010 | Jung et al. |
| 2010/0133994 A1 | 6/2010 | Song et al. |
| 2010/0134456 A1 | 6/2010 | Oyamada |
| 2010/0140600 A1 | 6/2010 | Clough et al. |
| 2010/0156279 A1 | 6/2010 | Tamura et al. |
| 2010/0237374 A1 | 9/2010 | Chu et al. |
| 2010/0328294 A1 | 12/2010 | Sasaki et al. |
| 2011/0090210 A1 | 4/2011 | Sasaki et al. |
| 2011/0133636 A1 | 6/2011 | Matsuo et al. |
| 2011/0180825 A1 | 7/2011 | Lee et al. |
| 2012/0212468 A1 | 8/2012 | Govil |
| 2013/0009930 A1 | 1/2013 | Cho et al. |
| 2013/0032831 A1 | 2/2013 | Chaji et al. |
| 2013/0113785 A1 | 5/2013 | Sumi |

FOREIGN PATENT DOCUMENTS

| | | |
|---|---|---|
| CA | 2 249 592 | 7/1998 |
| CA | 2 368 386 | 9/1999 |
| CA | 2 242 720 | 1/2000 |
| CA | 2 354 018 | 6/2000 |
| CA | 2 436 451 | 8/2002 |
| CA | 2 438 577 | 8/2002 |
| CA | 2 483 645 | 12/2003 |
| CA | 2 463 653 | 1/2004 |
| CA | 2498136 | 3/2004 |
| CA | 2522396 | 11/2004 |
| CA | 2443206 | 3/2005 |
| CA | 2472671 | 12/2005 |
| CA | 2567076 | 1/2006 |
| CA | 2526782 | 4/2006 |
| CN | 1381032 | 11/2002 |
| CN | 1448908 | 10/2003 |
| CN | 1776922 | 5/2006 |
| DE | 20 2006 00542 | 6/2006 |
| EP | 0 940 796 | 9/1999 |
| EP | 1 028 471 A | 8/2000 |
| EP | 1 103 947 | 5/2001 |
| EP | 1 130 565 A1 | 9/2001 |
| EP | 1 184 833 | 3/2002 |
| EP | 1 194 013 | 4/2002 |
| EP | 1 310 939 | 5/2003 |
| EP | 1 335 430 A1 | 8/2003 |
| EP | 1 372 136 | 12/2003 |
| EP | 1 381 019 | 1/2004 |
| EP | 1 418 566 | 5/2004 |
| EP | 1 429 312 A | 6/2004 |
| EP | 1 439 520 | 7/2004 |
| EP | 1 465 143 A | 10/2004 |
| EP | 1 467 408 | 10/2004 |
| EP | 1 517 290 | 3/2005 |
| EP | 1 521 203 A2 | 4/2005 |
| EP | 2317499 | 5/2011 |
| GB | 2 205 431 | 12/1988 |
| JP | 09 090405 | 4/1997 |
| JP | 10-153759 | 6/1998 |
| JP | 10-254410 | 9/1998 |
| JP | 11 231805 | 8/1999 |
| JP | 11-282419 | 10/1999 |
| JP | 2000/056847 | 2/2000 |
| JP | 2000-077192 | 3/2000 |
| JP | 2000-089198 | 3/2000 |
| JP | 2000-352941 | 12/2000 |
| JP | 2002-91376 | 3/2002 |
| JP | 2002-268576 | 9/2002 |
| JP | 2002-278513 | 9/2002 |
| JP | 2002-333862 | 11/2002 |
| JP | 2003-022035 | 1/2003 |
| JP | 2003-076331 | 3/2003 |
| JP | 2003-150082 | 5/2003 |
| JP | 2003-177709 | 6/2003 |
| JP | 2003-271095 | 9/2003 |
| JP | 2003-308046 | 10/2003 |
| JP | 2005-057217 | 3/2005 |
| JP | 2006065148 | 3/2006 |
| JP | 2009282158 | 12/2009 |
| TW | 485337 | 5/2002 |
| TW | 502233 | 9/2002 |
| TW | 538650 | 6/2003 |
| TW | 569173 | 1/2004 |
| WO | WO 94/25954 | 11/1994 |
| WO | WO 99/48079 | 9/1999 |
| WO | WO 01/27910 A1 | 4/2001 |
| WO | WO 02/067327 A | 8/2002 |
| WO | WO 03/034389 A | 4/2003 |
| WO | WO 03/063124 | 7/2003 |
| WO | WO 03/077231 | 9/2003 |
| WO | WO 03/105117 | 12/2003 |
| WO | WO 2004/003877 | 1/2004 |
| WO | WO 2004/034364 | 4/2004 |

(56) References Cited

FOREIGN PATENT DOCUMENTS

| WO | WO 2005/022498 | 3/2005 |
|---|---|---|
| WO | WO 2005/029455 | 3/2005 |
| WO | WO 2005/055185 | 6/2005 |
| WO | WO 2006/053424 | 5/2006 |
| WO | WO 2006/063448 A | 6/2006 |
| WO | WO 2006/137337 | 12/2006 |
| WO | WO 2007/003877 A | 1/2007 |
| WO | WO 2007/079572 | 7/2007 |
| WO | WO 2010/023270 | 3/2010 |

OTHER PUBLICATIONS

Alexander et al.: "Pixel circuits and drive schemes for glass and elastic AMOLED displays"; dated Jul. 2005 (9 pages).
Alexander et al.: "Unique Electrical Measurement Technology for Compensation, Inspection, and Process Diagnostics of AMOLED HDTV"; dated May 2010 (4 pages).
Ashtiani et al.: "AMOLED Pixel Circuit With Electronic Compensation of Luminance Degradation"; dated Mar. 2007 (4 pages).
Chaji et al.: "A Current-Mode Comparator for Digital Calibration of Amorphous Silicon AMOLED Displays"; dated Jul. 2008 (5 pages).
Chaji et al.: "A fast settling current driver based on the CCII for AMOLED displays"; dated Dec. 2009 (6 pages).
Chaji et al.: "A Low-Cost Stable Amorphous Silicon AMOLED Display with Full V~T- and V~O~L~E~D Shift Compensation"; dated May 2007 (4 pages).
Chaji et al.: "A low-power driving scheme for a-Si:H active-matrix organic light-emitting diode displays"; dated Jun. 2005 (4 pages).
Chaji et al.: "A low-power high-performance digital circuit for deep submicron technologies"; dated Jun. 2005 (4 pages).
Chaji et al.: "A novel a-Si:H AMOLED pixel circuit based on short-term stress stability of a-Si:H TFTs"; dated Oct. 2005 (3 pages).
Chaji et al.: "A Novel Driving Scheme and Pixel Circuit for AMOLED Displays"; dated Jun. 2006 (4 pages).
Chaji et al.: "A novel driving scheme for high-resolution large-area a-Si:H AMOLED displays"; dated Aug. 2005 (4 pages).
Chaji et al.: "A Stable Voltage-Programmed Pixel Circuit for a-Si:H AMOLED Displays"; dated Dec. 2006 (12 pages).
Chaji et al.: "A Sub-μA fast-settling current-programmed pixel circuit for AMOLED displays"; dated Sep. 2007.
Chaji et al.: "An Enhanced and Simplified Optical Feedback Pixel Circuit for AMOLED Displays"; dated Oct. 2006.
Chaji et al.: "Compensation technique for DC and transient instability of thin film transistor circuits for large-area devices"; dated Aug. 2008.
Chaji et al.: "Driving scheme for stable operation of 2-TFT a-Si AMOLED pixel"; dated Apr. 2005 (2 pages).
Chaji et al.: "Dynamic-effect compensating technique for stable a-Si:H AMOLED displays"; dated Aug. 2005 (4 pages).
Chaji et al.: "Electrical Compensation of OLED Luminance Degradation"; dated Dec. 2007 (3 pages).
Chaji et al.: "eUTDSP: a design study of a new VLIW-based DSP architecture"; dated May 2003 (4 pages).
Chaji et al.: "Fast and Offset-Leakage Insensitive Current-Mode Line Driver for Active Matrix Displays and Sensors"; dated Feb. 2009 (8 pages).
Chaji et al.: "High Speed Low Power Adder Design With a New Logic Style: Pseudo Dynamic Logic (SDL)"; dated Oct. 2001 (4 pages).
Chaji et al.: "High-precision, fast current source for large-area current-programmed a-Si flat panels"; dated Sep. 2006 (4 pages).
Chaji et al.: "Low-Cost AMOLED Television with IGNIS Compensating Technology"; dated May 2008 (4 pages).
Chaji et al.: "Low-Cost Stable a-Si:H AMOLED Display for Portable Applications"; dated Jun. 2006 (4 pages).
Chaji et al.: "Low-Power Low-Cost Voltage-Programmed a-Si:H AMOLED Display"; dated Jun. 2008 (5 pages).

Chaji et al.: "Merged phototransistor pixel with enhanced near infrared response and flicker noise reduction for biomolecular imaging"; dated Nov. 2008 (3 pages).
Chaji et al.: "Parallel Addressing Scheme for Voltage-Programmed Active-Matrix OLED Displays"; dated May 2007 (6 pages).
Chaji et al.: "Pseudo dynamic logic (SDL): a high-speed and low-power dynamic logic family"; dated 2002 (4 pages).
Chaji et al.: "Stable a-Si:H circuits based on short-term stress stability of amorphous silicon thin film transistors"; dated May 2006 (4 pages).
Chaji et al.: "Stable Pixel Circuit for Small-Area High-Resolution a-Si:H AMOLED Displays"; dated Oct. 2008 (6 pages).
Chaji et al.: "Stable RGBW AMOLED display with OLED degradation compensation using electrical feedback"; dated Feb. 2010 (2 pages).
Chaji et al.: "Thin-Film Transistor Integration for Biomedical Imaging and AMOLED Displays"; dated 2008 (177 pages).
European Search Report and Written Opinion for Application No. 08 86 5338 dated Nov. 2, 2011 (7 pages).
European Search Report for European Application No. EP 04 78 6661 dated Mar. 9, 2009.
European Search Report for European Application No. EP 05 75 9141 dated Oct. 30, 2009.
European Search Report for European Application No. EP 05 82 1114 dated Mar. 27, 2009 (2 pages).
European Search Report for European Application No. EP 07 71 9579 dated May 20, 2009.
European Search Report dated Mar. 26, 2012 in corresponding European Patent Application No. 10000421.7 (6 pages).
Extended European Search Report dated Apr. 27, 2011 issued during prosecution of European patent application No. 09733076.5 (13 pages).
Goh et al., "A New a-Si:H Thin Film Transistor Pixel Circul for Active-Matrix Organic Light-Emitting Diodes", IEEE Electron Device Letters, vol. 24, No. 9, Sep. 2003, 4 pages.
International Search Report for International Application No. PCT/CA02/00180 dated Jul. 31, 2002 (3 pages).
International Search Report for International Application No. PCT/CA2004/001741 dated Feb. 21, 2005.
International Search Report for International Application No. PCT/CA2005/001844 dated Mar. 28, 2006 (2 pages).
International Search Report for International Application No. PCT/CA2005/001007 dated Oct. 18, 2005.
International Search Report for International Application No. PCT/CA2007/000652 dated Jul. 25, 2007.
International Search Report for International Application No. PCT/CA2008/002307, dated Apr. 28. 2009 (3 pages).
International Search Report for International Application No. PCT/IB2011/055135, Canadian Patent Office, dated Apr. 16, 2012 (5 pages).
International Search Report dated Jul. 30, 2009 for International Application No. PCT/CA2009/000501 (4 pages).
Jafarabadiashtiani et al.: "A New Driving Method for a-Si AMOLED Displays Based on Voltage Feedback"; dated 2005 (4 pages).
Lee et al.: "Ambipolar Thin-Film Transistors Fabricated by PECVD Nanocrystalline Silicon"; dated 2006 (6 pages).
Ma e y et al: "Organic Light-Emitting Diode/Thin Film Transistor Integration for foldable Displays" Conference record of the 1997 International display research conference and international workshops on LCD technology and emissive technology. Toronto, Sep. 15-19, 1997 (6 pages).
Matsueda y et al.: "35.1: 2.5-in. AMOLED with Integrated 6-bit Gamma Compensated Digital Data Driver"; dated May 2004.
Nathan et al.: "Backplane Requirements for Active Matrix Organic Light Emitting Diode Displays"; dated 2006 (16 pages).
Nathan et al.: "Call for papers second international workshop on compact thin-film transistor (TFT) modeling for circuit simulation"; dated Sep. 2009 (1 page).
Nathan et al.: "Driving schemes for a-Si and LTPS AMOLED displays"; dated Dec. 2005 (11 pages).
Nathan et al.: "Invited Paper: a -Si for AMOLED—Meeting the Performance and Cost Demands of Display Applications (Cell Phone to HDTV)"; dated 2006 (4 pages).

(56) References Cited

OTHER PUBLICATIONS

Nathan et al.: "Thin film imaging technology on glass and plastic" ICM 2000, Proceedings of the 12$^{th}$ International Conference on Microelectronics, (IEEE Cat. No. 00EX453), Tehran Iran; dated Oct. 31-Nov. 2, 2000, pp. 11-14, ISBN: 964-360-057-2, p. 13, col. 1, line 11-48; (4 pages).
Nathan et al., "Amorphous Silicon Thin Film Transistor Circuit Integration for Organic LED Displays on Glass and Plastic", IEEE Journal of Solid-State Circuits, vol. 39, No. 9, Sep. 2004, pp. 1477-1486.
Office Action issued in Chinese Patent Application 200910246264.4 dated Jul. 5, 2013; 8 pages.
Patent Abstracts of Japan, vol. 2000, No. 09, Oct. 13, 2000—JP 2000 172199 A, Jun. 3, 2000, abstract.
Patent Abstracts of Japan, vol. 2002, No. 03, Apr. 3, 2002 (Apr. 4, 2004 & JP 2001 318627 A (Semiconductor EnergyLab DO LTD), Nov. 16, 2001, abstract, paragraphs '01331-01801, paragraph '01691, paragraph '01701, paragraph '01721 and figure 10.
Philipp: "Charge transfer sensing" Sensor Review, vol. 19, No. 2, Dec. 31, 1999 (Dec. 31, 1999), 10 pages.
Rafati et al.: "Comparison of a 17 b multiplier in Dual-rail domino and in Dual-rail D L (D L) logic styles"; dated 2002 (4 pages).
Safavaian et al.: "Three-TFT image sensor for real-time digital X-ray imaging"; dated Feb. 2, 2006 (2 pages).
Safavian et al.: "3-TFT active pixel sensor with correlated double sampling readout circuit for real-time medical x-ray imaging"; dated Jun. 2006 (4 pages).
Safavian et al.: "A novel current scaling active pixel sensor with correlated double sampling readout circuit for real time medical x-ray imaging"; dated May 2007 (7 pages).
Safavian et al.: "A novel hybrid active-passive pixel with correlated double sampling CMOS readout circuit for medical x-ray imaging"; dated May 2008 (4 pages).
Safavian et al.: "Self-compensated a-Si:H detector with current-mode readout circuit for digital X-ray fluoroscopy"; dated Aug. 2005 (4 pages).
Safavian et al.: "TFT active image sensor with current-mode readout circuit for digital x-ray fluoroscopy [5969D-82]"; dated Sep. 2005 (9 pages).
Sanford, James L., et al., "4.2 TFT AMOLED Pixel Circuits and Driving Methods", SID 03 Digest, ISSN/0003, 2003, pp. 10-13.
Stewart M. et al., "Polysilicon TFT technology for active matrix OLED displays" IEEE transactions on electron devices, vol. 48, No. 5; Dated May 2001 (7 pages).
Tatsuya Sasaoka et al., 24.4L; Late-News Paper: A 13.0-inch AM-Oled Display with Top Emitting Structure and Adaptive Current Mode Programmed Pixel Circuit (TAC), SID 01 Digest, (2001), pp. 384-387.
Vygranenko et al.: "Stability of indium-oxide thin-film transistors by reactive ion beam assisted deposition"; dated 2009.
Wang et al.: "Indium oxides by reactive ion beam assisted evaporation: From material study to device application"; dated Mar. 2009 (6 pages).
Written Opinion dated Jul. 30, 2009 for International Application No. PCT/CA2009/000501 (6 pages).
Yi He et al., "Current-Source a-Si:H Thin Film Transistor Circuit for Active-Matrix Organic Light-Emitting Displays", IEEE Electron Device Letters, vol. 21, No. 12, Dec. 2000, pp. 590-592.
Zhiguo Meng et al; "24.3: Active-Matrix Organic Light-Emitting Diode Display implemented Using Metal-Induced Unilaterally Crystallized Polycrystalline Silicon Thin-Film Transistors", SID 01Digest, (2001), pp. 380-383.
International Search Report for Application No. PCT/IB2014/059409, Canadian Intellectual Property Office, dated Jun. 12, 2014 (4 pages).
Written Opinion for Application No. PCT/IB2014/059409, Canadian Intellectual Property Office, dated Jun. 12, 2014 (5 pages).
Extended European Search Report for Application No. EP 14181848.4, dated Mar. 5, 2015, (9 pages).

\* cited by examiner

PIXEL HAVING AN ORGANIC LIGHT EMITTING DIODE AND METHOD OF FABRICATING THE PIXEL

CROSS REFERENCE TO RELATED APPLICATIONS

This application is a continuation of U.S. application Ser. No. 13/112,654, filed May 20, 2011, which is a continuation of U.S. application Ser. No. 10/546,695, filed May 18, 2006, which is a U.S. National Stage of International Application No. PCT/CA2004/00256, filed Feb. 24, 2003, which claims priority to Canadian Patent No. 2,419,704, filed Feb. 24, 2003, each of which is hereby incorporated by reference herein in its entirety.

FIELD OF THE INVENTION

This invention relates to a pixel, more particularly, to a pixel having an organic emitting diode.

BACKGROUND OF THE INVENTION

Organic light emitting diodes (OLEDS) are electro-luminescent (EL) devices for emitting light. The OLED generates light by a current flowing through an organic compound. Pixels including the OLEDs have various advantages, i.e. simple structure, fast response and wide viewing angle. There are two types of matrix displays with the OLEDs, passive type and active type. In the active matrix display, thin-film transistors (TFT) are provided in each pixel to drive the OLEDs of display. The active matrix eliminates high peak driving currents and thereby enables high-resolutions and high information density, improves power consumption and life-time compared to the passive matrix.

Vertical pixel architecture, in which the TFT and the OLED device are stacked vertically, has been developed. Such architecture can achieve higher aperture ratios. This favors using lower mobility amorphous silicon TFT backplanes compared polysilicon TFT technology, which is of higher mobility but also of higher cost.

The difficult part in building the vertical stacked pixels is to make a TFT backplane suitable for subsequent OLED fabrication and provide high yield and good performance of OLED pixels. The OLED device is typically made of very thin layers. Overall thickness of organic layers in the OLED is of the order of 100 nm. For this reason, it requires a smooth substrate to achieve good performance and yield. Step-wise features on the substrate surface and roughness can cause deterioration of light-emitting properties or OLED device failure due to shorts between its electrodes.

It is, therefore, desirable to provide new pixel architecture, which can achieve a high aperture rate, and at the same time, higher yield rate.

SUMMARY OF THE INVENTION

It is an object of the invention to provide novel pixel architecture that obviates or mitigates at least one of the disadvantages of existing pixels.

In accordance with an aspect of the present invention, there is provided vertical pixel architecture in which a planarization dielectric layer is disposed between a TFT based backplane and OLED layers. The planarization dielectric layer is thick enough to smoothen a TFT substrate profile to such an extent that will make it suitable for subsequent fabrication of the OLEDs. Preferably, the planarization dielectric and subsequent electrode layer have a roughness of the order of 1 nm to permit successful OLED fabrication. Electrical connection between TFT circuit and OLED is provided by means through-via made in planarization dielectric.

In accordance with a further aspect of the present invention, there is provided a vertical pixel architecture in which continuous sidewall coverage is provided by pixel electrode material in a through-via profile provided in the planarization dielectric. This is achieved by the formation of sloped sidewalls of the through-via. Preferably, the angle between the via and a TFT substrate is less than 45 degrees.

In accordance with a further aspect of the present invention, the interconnection between TFT final metal and OLED bottom electrode in vertical pixel architecture is provided via a smooth contact plate made of conductive material.

In accordance with a further aspect of the present invention, there is provided a vertical pixel architecture in which a dielectric layer is deposited and patterned on the top of the pixel electrode in such a way that it covers pixel via and the edges of the pixel electrode.

Other aspects and features of the present invention will be readily apparent to those skilled in the art from a review of the following detailed description of preferred embodiments in conjunction with the accompanying drawings.

BRIEF DESCRIPTION OF THE DRAWINGS

The invention will be further understood from the following description with reference to the drawings in which.

DETAILED DESCRIPTION OF THE PREFERRED EMBODIMENTS

Figure 1:
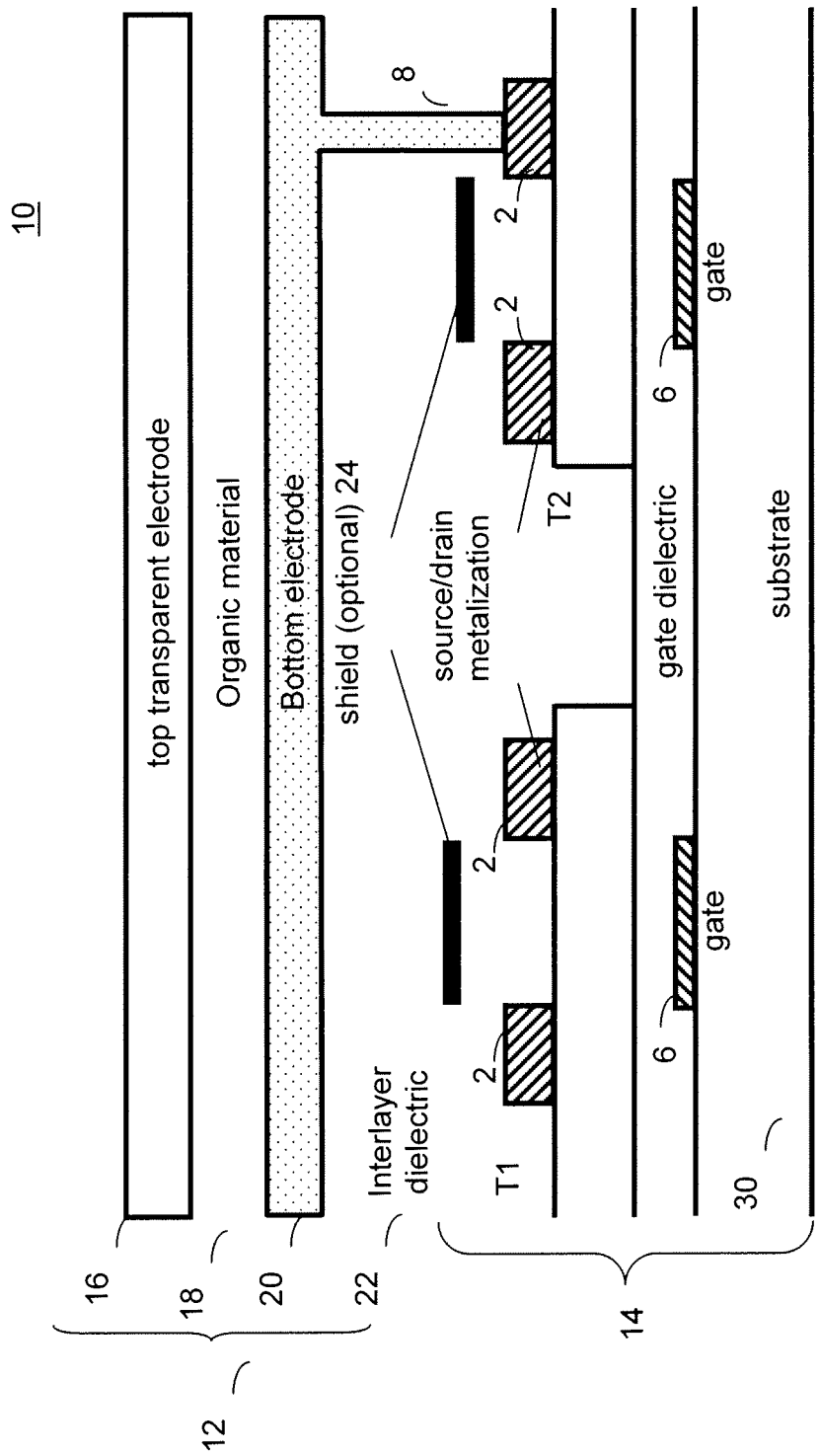
FIG. 1 is a schematic cross-section view showing a vertically integrated pixel in accordance with an embodiment of the present invention.

A vertically integrated pixel of the present invention is described. FIG. 1 shows a vertically integrated pixel 10 in accordance with an embodiment of the present invention.

The pixel 10 includes OLED device layer 12 and a TFT based backplane 14 (hereinafter referred to as TFT backplane).

The OLED device 12 includes one or more organic layers, a cathode and an anode. In the description, layers between the cathode and the anode are referred to as OLED layers 18. The OLED layers 18 may be incorporating an electron transport layer, an organic light emitting layer, a hole transport layer, and a hole injection layer. In FIG. 1, an OLED top electrode 16 and an OLED bottom electrode 20 are shown as the cathode and the anode, respectively.

The top electrode 16 is transparent to enable the light to be emitted by the OLED in the direction opposite to the substrate (i.e., top-emitting OLED). However, reverse top-emitting OLED structure, where the bottom electrode 20 is a cathode, and the top electrode 16 is an (transparent) anode, is also possible.

Each pixel of the TFT backplane 14 includes TFT pixel circuits formed on a substrate 30. In FIG. 1, two TFTs T1 and T2 form a pixel circuit. Each of the transistors T1-T2 has metallization for a source, a drain and a gate 6. In FIG. 1, "2" represents either a source node or a drain node. However, the pixel 10 may include more than two transistors.

The OLED bottom electrode 20 is formed on the top of the TFT backplane 14, and is separated from the backplane 14 by a dielectric layer 22. The dielectric layer 22 is continuously provided everywhere on the top of the TFT pixel circuit except at a through-via 8, which provides electrical connection between a specific node of the TFT pixel circuit and the OLED bottom electrode 20. This specific node may be source node or drain node of a TFT, which depends on pixel circuit design and order of deposition for the OLED electrodes and layers. The details of circuit design and OLED fabrication are not to restrict the applicability of the present invention.

Preferably, the planarization dielectric and subsequent electrode layer have a roughness of the order of 1 nm to permit successful OLED fabrication. Optionally, a shield electrode 24 is provided on the top of TFTs.

Figure 2:
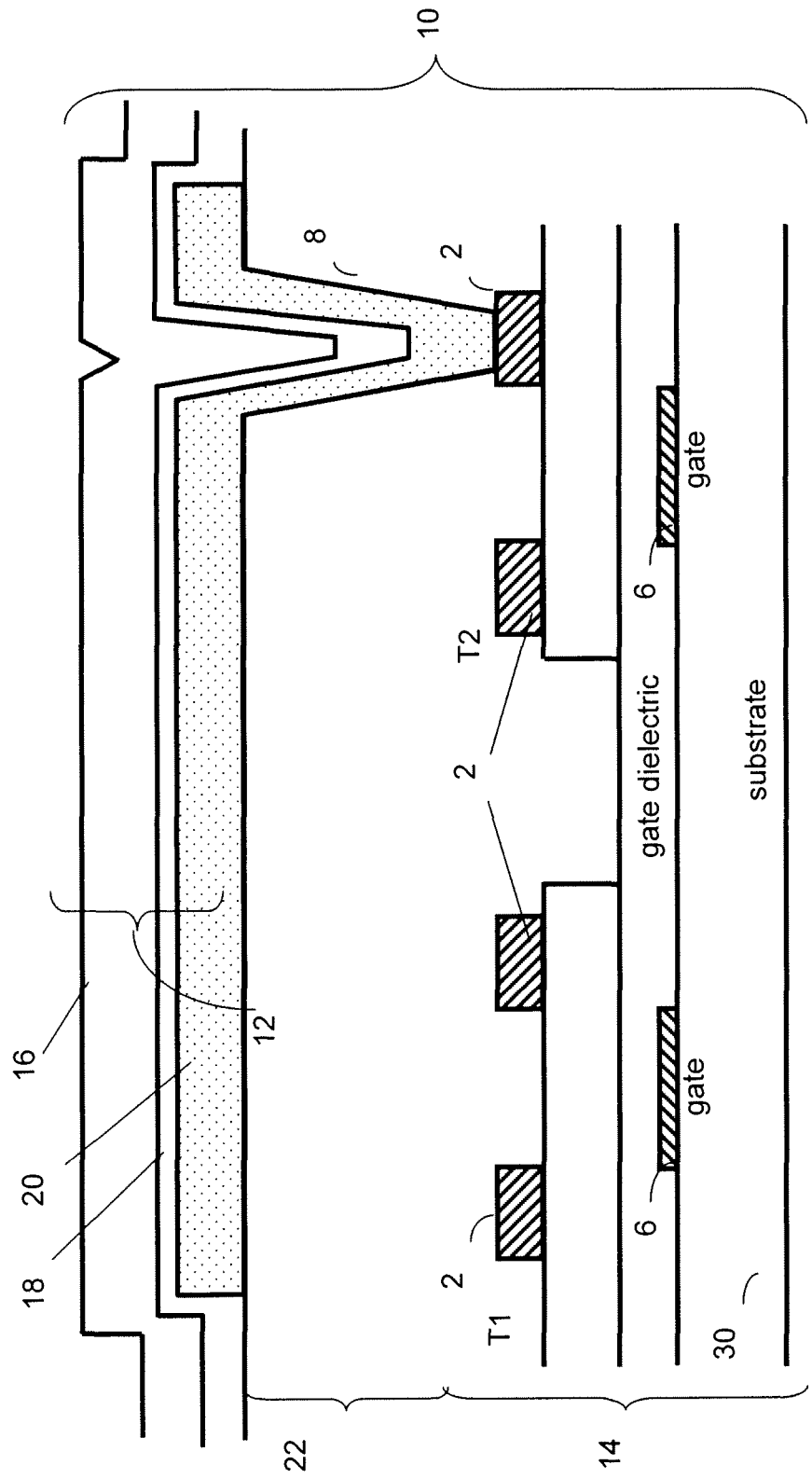
FIG. 2 is a schematic cross-section view showing an example of the pixel of FIG. 1.

FIG. 2 shows an example of the pixel 10 of FIG. 1. In FIG. 2, the sidewalls of the through-via 8 are sloped. The OLED bottom electrode material is disposed on the top surface of the dielectric layer 22 and along the sidewall of the sloped through-via 8.

Figure 3:
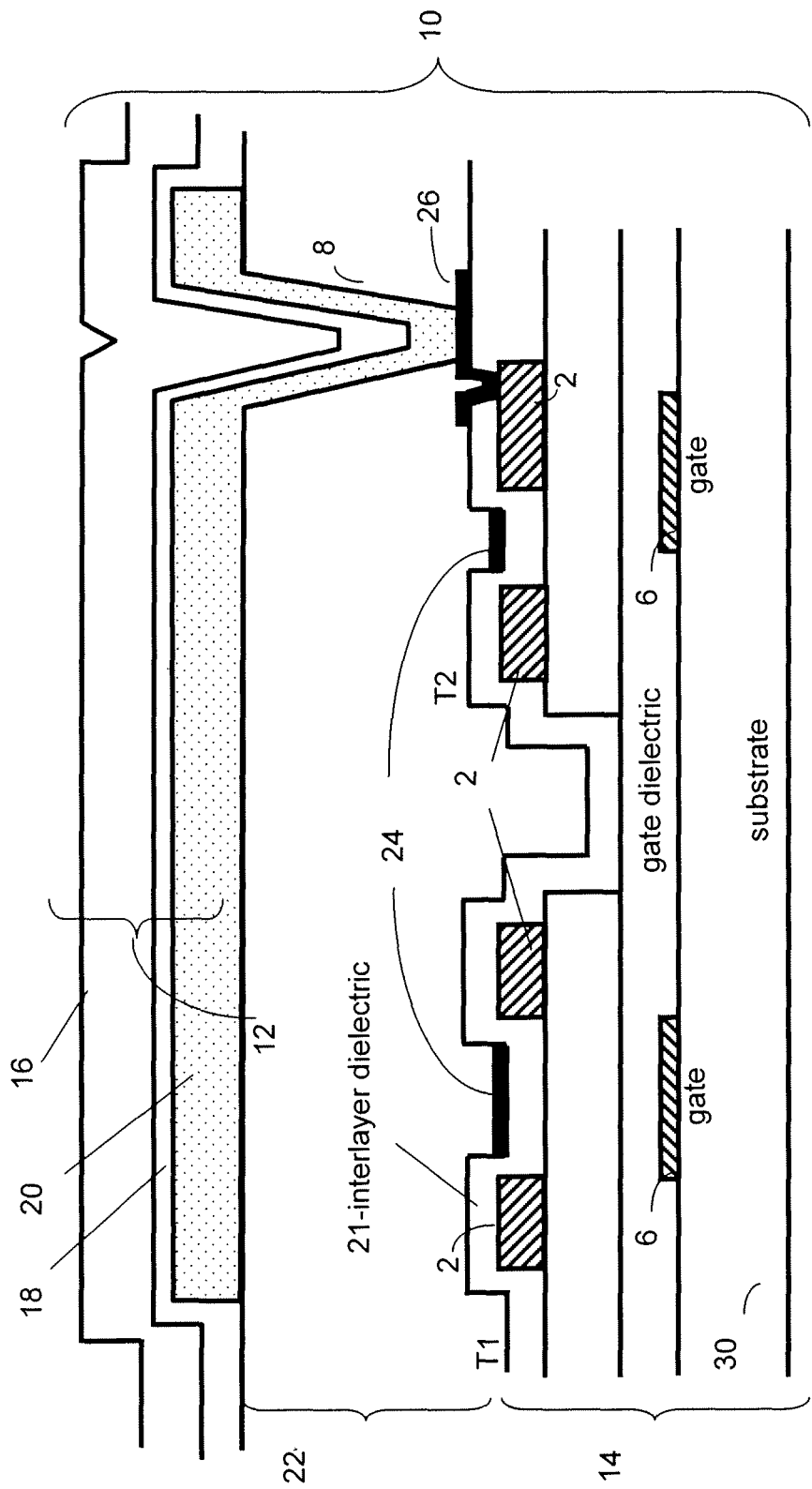
FIG. 3 is a schematic cross-section view showing an example of the pixel of FIG. 1, which incorporates a shield electrode.

FIG. 3 is another example of the pixel of FIG. 1. In FIG. 3, the shield electrode 24 is provided above the TFT layers to keep the potential right on the top of the TFT pixel circuit at certain designed level regardless of the potential of the pixel electrode. The shield electrode 24 may be a thin-film conductor, Al, Al-alloy, Mo, Cr or the like. An interlayer dielectric 21 is provided between source/drain and shield layers. The connection between the desired pixel circuit node and the OLED bottom electrode 20 is made by means-of a via in the interlayer insulator 21, an interconnection plate 26 formed in the shield metal layer and the through-via 8 formed in the dielectric layer 22.

The transistor structure of FIGS. 1-3 is typical for bottom-gate amorphous silicon TFT, and it is shown here as one possible example only. However, the method of pixel integration described here may be applicable in general to any appropriate known TFT backplane, including recrystallized or deposited poly-silicon, micro- and nano-crystalline silicon, CdSe and others.

Active matrix TFT backplane may be fabricated by successive deposition and patterning of metal, insulator and semiconductor layers leading to an overall profile height of the structure that is in the range of a few 100 nm to 1 micron, with nearly vertical or sharp-angled sidewalls of the structures. On the other hand, in high performance small molecule and polymer organic light emitting devices, active organic layers have an overall thickness in the range of 10-100 nm. This implies that it is desirable to provide the OLED substrate with the roughness in 1 nm range to prevent electrical shorts between OLED layers or top and bottom electrodes. In addition, it is desirable that the substrate is either planer or has sufficiently smooth features whose vertical profile does not prevent reliable step coverage with thin OLED layers and their continuity, where necessary.

In the embodiment of the preset invention, the planarization dielectric and subsequent electrode layer are formed so as to have a roughness of the order of 1 nm. The dielectric layer 22 smoothens or planarizes the vertical profiles of the structures on the substrate with fabricated TFT 14. Further, the through-via profile in the dielectric layer 22 enables continuous sidewall coverage by the OLED bottom electrode material, and reduction of thickness of the pixel electrode.

The dielectric layer 22 of the pixel 10 is described in detail. The dielectric layer 22, which is used for separating the TFT backplane 14 and the OLED bottom electrode 20, smoothens or planarizes the vertical profiles of the structures on the substrate 30 with the fabricated TFT backplane 14. This ensures continuity of the electrodes 16, 20 and organic layers 18 in the OLED device 12. This smooting/planarizing is achieved by using a planarizing dielectric, rather than one coating the substrate conformally. The planarizing dielectric may be an organic polymer such as benzocyclobutene (BCB), polyimide, polyamide, acrilic and others. Minimum thickness of planarization layer required depends on planarization properties of the dielectric and the profile height of TFT backplane. The thickness of planarizing dielectric can be between 0.5 and 5 ·mu·m. In the embodiment of the present invention, BCB layer, about 3 micron-thick, produced from photosensitive BCB-material is used as the planarizing layer.

Planarizing dielectric layers are most often produced by application of corresponding initial material or monomer, which can be polymerized on the substrate by means of thermal cure, UV-cure with our without catalyst or by other method. The initial or monomer material can or cannot be patterned by photo-exposure. This property depends on chemical formulation of initial material or monomer by the manufacturer, whether the photosensitive components were added or not. The processing of the former may include steps such as application of initial material, pattern definition by photoexposure trough a photomask, pattern developing and final cure. As a result a patterned polymer layer is obtained. The processing of the latter may include application of initial material, cure, application and patterning of the mask, patterning cured polymer by means of plasma or wet etching with the mask, strip the mask. In some cases, like polyimides and BCB, there are available both photosensitive and non-photosensitive versions of initial material that can lead to about the same chemical composition and structure of polymer dielectric material after final cure.

In the embodiment of the present invention, BCB-layer made of photosensitive initial material is used as a planarization dielectric. However, the present invention may be applicable to different types of material, such as but not limited to other planarization materials made of both of photosensitive and non-photosensitive initial formulations.

Figure 4:
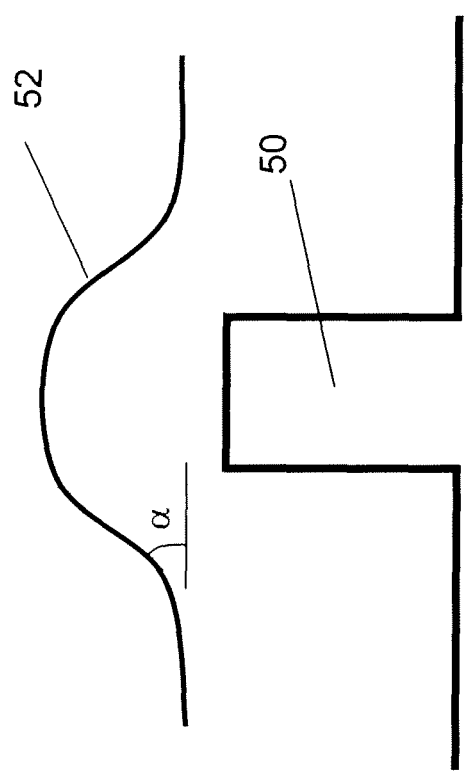
FIG. 4 is a schematic diagram showing an example of surface planarization with BCB.

FIG. 4 shows the planarization effect of BCB-layer. In this example, a TFT substrate is schematically shown as-having stepwise profile of the patterns 50 with nearly vertical sidewalls and profile height of 0.5-0.9 .mu·m before application of BCB. After application of BCB-film, the patterns 50 are translated into 0.3-0.5 micron profiles 52 with the sidewall angle a about 10 degrees on the surface of BCB dielectric. In this example, the BCB-polymer film was produced by spin-coating photosensitive material (photosensitive BCB) with subsequent soft bake, exposure, post-exposure bake, pattern developing, solvent removal and cure. The process conditions are shown in Table 1.

TABLE 1

Process conditions for planarization layer

| Nr | Step | Conditions |
|---|---|---|
| 1 | Spin-coating | 2500-4000 rpm, 25-40 sec |
| 2 | Soft-bake | 60-70 degree C., 90 sec |
| 3 | Exposure | 12-60 sec |
| 4 | Post-exposure bake | 50-60.degree C., 30 sec |
| 5 | Developing | 2-4 min |
| 6 | Solvent removal | 75 degree C., 60 sec |
| 7 | Cure | 190-250.degree C., 2-4 hrs |

The through-via profile in the dielectric 22 of the pixel 10 is now described in detail. The OLED bottom electrode 20 is a conductive material such as indium-tin oxide (ITO) or the like, a metal film, Au, Pd, Ni or the like, sputtered, evaporated or fabricated by other method of thin film deposition. Other metals or thin multi-layer metal coatings may be also applicable. Typically, conductive layers in a flat-panel display substrate are fabricated by sputtering which has limitations in terms of step coverage. On the other hand, the roughness of the conductive layers such as metal films and ITO, increases with layer thickness. A thinner electrode layer produces a smoother surface suitable for OLED fabrication. This also reduces the cost of production. Therefore, a reduction of the thickness of the pixel electrode while maintaining its continuity over substrate profile is desirable.

If the through-via had a nearly vertical sidewall, the thickness of the metal to cover sidewall continuously, could be of the same order as the depth of the via, which is equal to the thickness of the planarization dielectric layer (in a range of few micron). In the pixel 10 of FIGS. 2 to 3, the sidewall is made sloped rather than vertical. That permits the thickness of the pixel electrode to be reduced substantially in a vertically stacked pixel structure.

Figure 5:
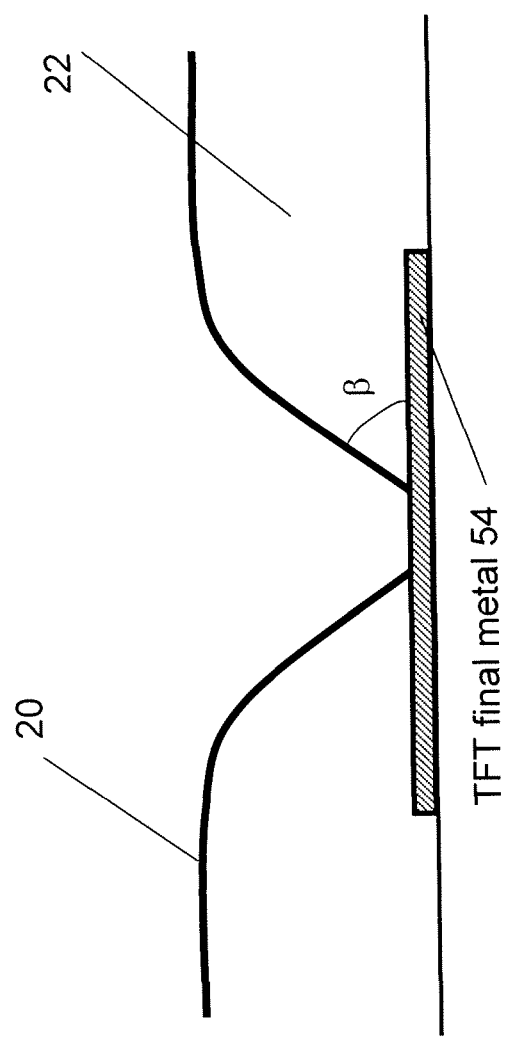
FIG. 5 is a schematic cross-section view showing a sidewall slope .beta. of the pixel of FIGS. 2 to 3.

FIG. 5 shows one example of a sidewall slop inside the via 8 of FIGS. 2 and 3. In FIG. 5, an angle .beta. between the OLED bottom electrode 20 on the sidewall and a TFT final material 54 is less than 90 degrees. If planarizing polymer dielectric is formed from photosensitive initial formulation, the sloped sidewall can be achieved by means of appropriate exposure conditions.

An example of sidewall slope control in the through-via for BCB-layer (i.e., dielectric 22), which is produced from photosensitive initial material, is presented in Table 2.

TABLE 2

Sidewall angle in cured BCB layer which was produced from photosensitive BCB-material as a function of exposure time

| Exposure time, sec | Sidewall angle, deg |
|---|---|
| 20 | 45 |
| 30 | 33 |
| 13 | 27 |

The formation of the layer and patterning of the vias were achieved by means of spin-coating photosensitive BCB material with subsequent soft-bake, light-exposure, developing, developer solvent removal and cure. In Table 1, the sidewall angle .beta. between the planarization layer 22 and the TFT final material 54 is shown as a function of photosensitive BCB-exposure time.

After the exposure, the film underwent 30 seconds post-exposure bake at 55. degree C. and was developed for around 3 minutes in the developer solvent followed by 60 second bake at 75. degree C. for developer solvent removal and then final cure.

The conditions for spin-coating, soft-bake, exposure, post-exposure bake and final cure are variable, and may depend on pixel design requirements. Recommendations about process conditions of Photo-BCB are given, for example, by "Cyclotene™ 4000 Series Advanced Electronic Resins (Photo-BCB)" of Dow Chemical™, at hftp://www-.dow.com/cyclotene/prods/402235 htm.

As shown in Table 2, the sidewall angle .beta. relates to the exposure time. The sidewall angle .beta. becomes smaller when exposure time is longer. For example, for the sidewall angle .beta. of less than 45 degrees and the planarization dielectric thickness of around 3 .mu.m, the continuous coverage of the via sidewalls was achieved with a pixel electrode thickness of order 100 nm. This is much less than the through-via depth and enables the electrode surface of the OLED bottom electrode 20 to be sufficiently smooth.

For polymer dielectric material made of non-photosensitive initial formulation, the sloped sidewall can be also achieved. For example, this can be done, by optimizing masking and plasma etching steps.

The parameters, materials and/or process of fabricating the sloped through-vias 8 are adjusted so as to: ensure the continuous sidewall coverage by a material of the pixel electrode; make the roughness of the OLED electrode small enough (1 nm order) to prevent electrical shorts between the OLED top electrode 16 and the OLED bottom electrode 20.

Figure 6:
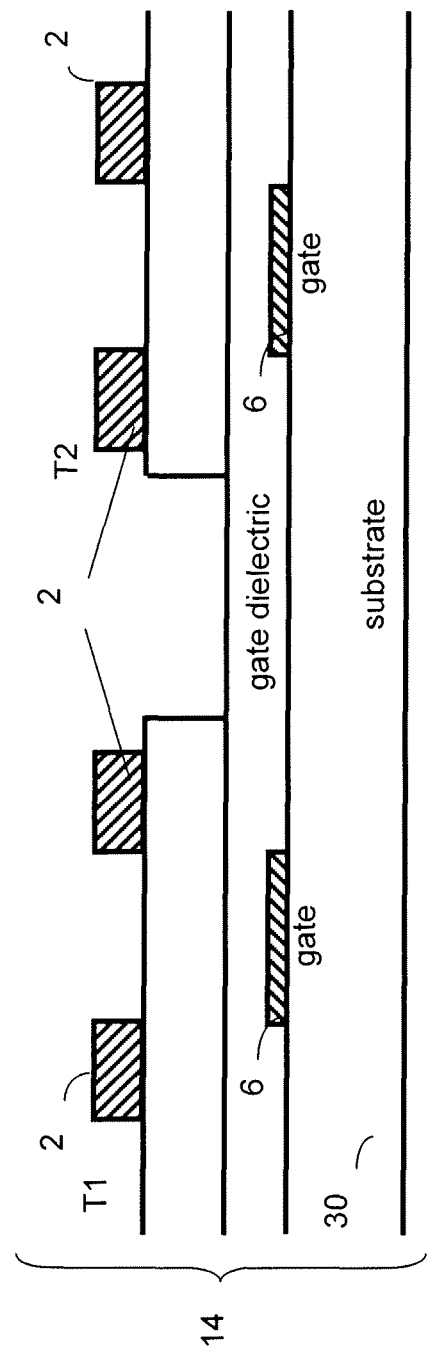
FIGS. 6 to 8 are schematic diagrams showing fabricating process of the pixel of FIG. 2.
Figure 7:
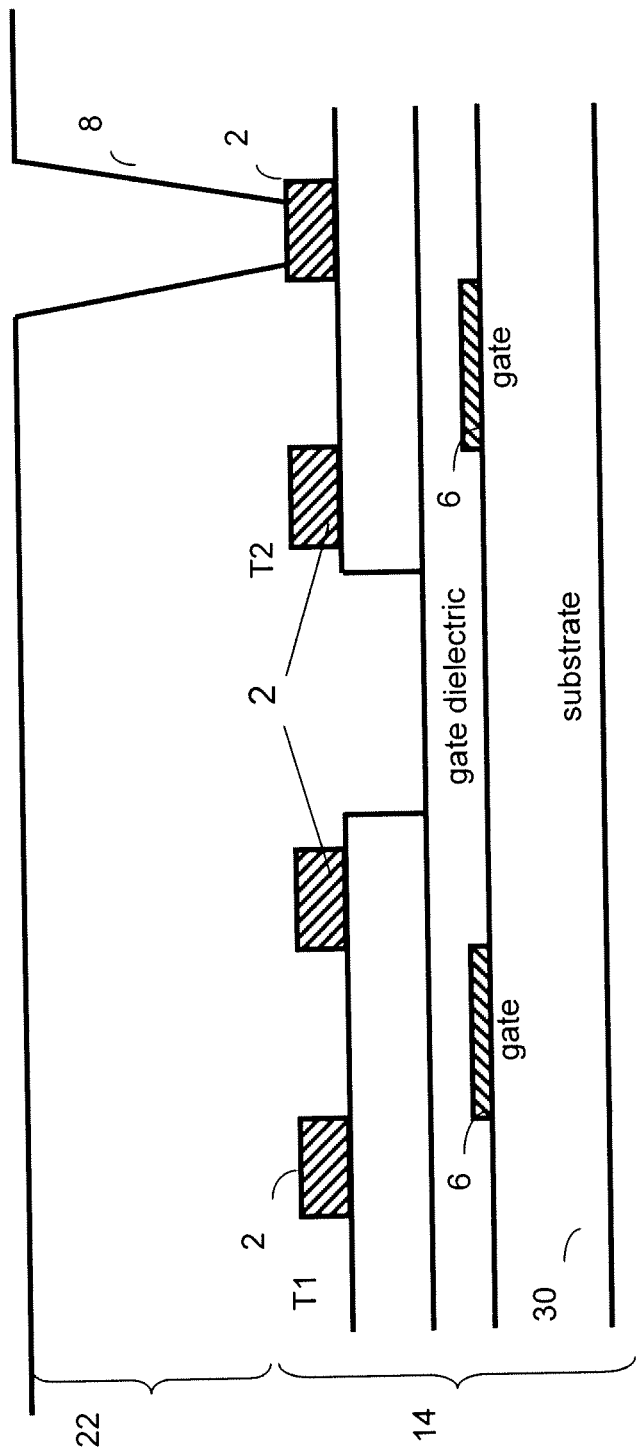
Figure 8:
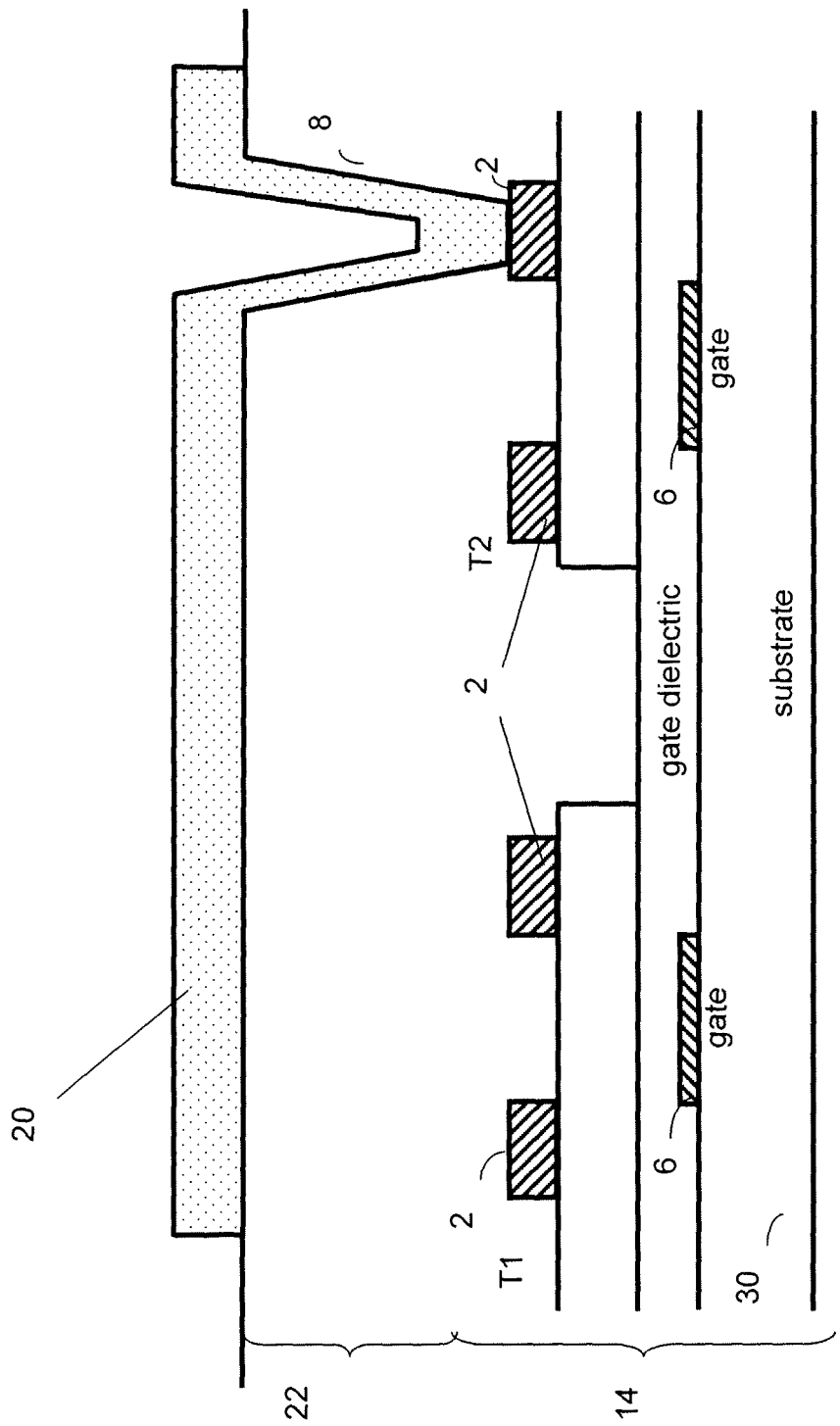

One example of fabricating the pixel 10 of FIG. 2 is shown in FIGS. 6 to 8. First, the TFT backplane 14 is fabricated (FIG. 6) on the substrate 30. Next, the TFT backplane 14 is coated with a planarization layer 22, where the vias 8 with sloped sidewalls are opened to the selected nodes of the TFT backplane 14 (FIG. 7). For BCB planarization layer made of photosensitive formulation, BCB material is applied by spin coating, and processed including soft-bake, UV-exposure through a photomask, post-exposure cure, developing, solvent removal and final cure. This sequence gives patterned material (with the through-vias 8) whose layer thickness and via sidewall slope depend on processing conditions, such as the exposure time as described above. Typically, surface roughness of cured BCB-layer is about 1 nm. Then, a thin residual layer on the bottom of the through-vias 8 is removed by plasma etching. Etching conditions are optimized for short etching time and minimum roughening of the BCB surface. For example, the fabrication of the pixel 10 may include plasma etching in CF4+O2 gas mixture or SF6+O2 gas mixture, a combination of high power high density plasma (for example, inductively coupled plasma) and low power reactive ion etching to achieve short etching time (few-20 seconds); and virtually no change in roughness after plasma etching.

Subsequently, a conductive material is deposited and patterned to form the OLED bottom electrode 20 (FIG. 8). Finally; the OLED layers 18 and transparent electrode top electrode 16 of the OLED are continuously applied over the pixels (FIG. 2).

The shield electrode 24 of FIG. 3 is now described in detail. As shown in FIG. 3, optional shield electrode can be incorporated in a pixel structure. After formation of the TFT backplane 14, interlayer dielectric 21 is deposited. This can be done by means of CVD, plasma-enhanced CVD process or other method. Silicon nitride, silicon oxide or silicon oxide nitride with the thickness between 0.1 and 1 .mu·m can be used as the interlayer dielectric 21. After formation of the vias in the interlayer dielectric that provide interconnection between source-drain and shield metallization layers, shield metal layer is deposited and patterned to form the shield electrodes 24 and interconnection plates 26. The interconnection plates 26 serve to carry the potential from the certain node of TFT pixel, which can be either source or drain of a TFT, to the bottom electrode of OLED device 20. Then, the planarization layer 22 is applied and patterned, as described above, which is followed by deposition and patterning of OLED bottom electrode 20, deposition of the OLED layers 18 and top transparent electrode 16.

Figure 9:
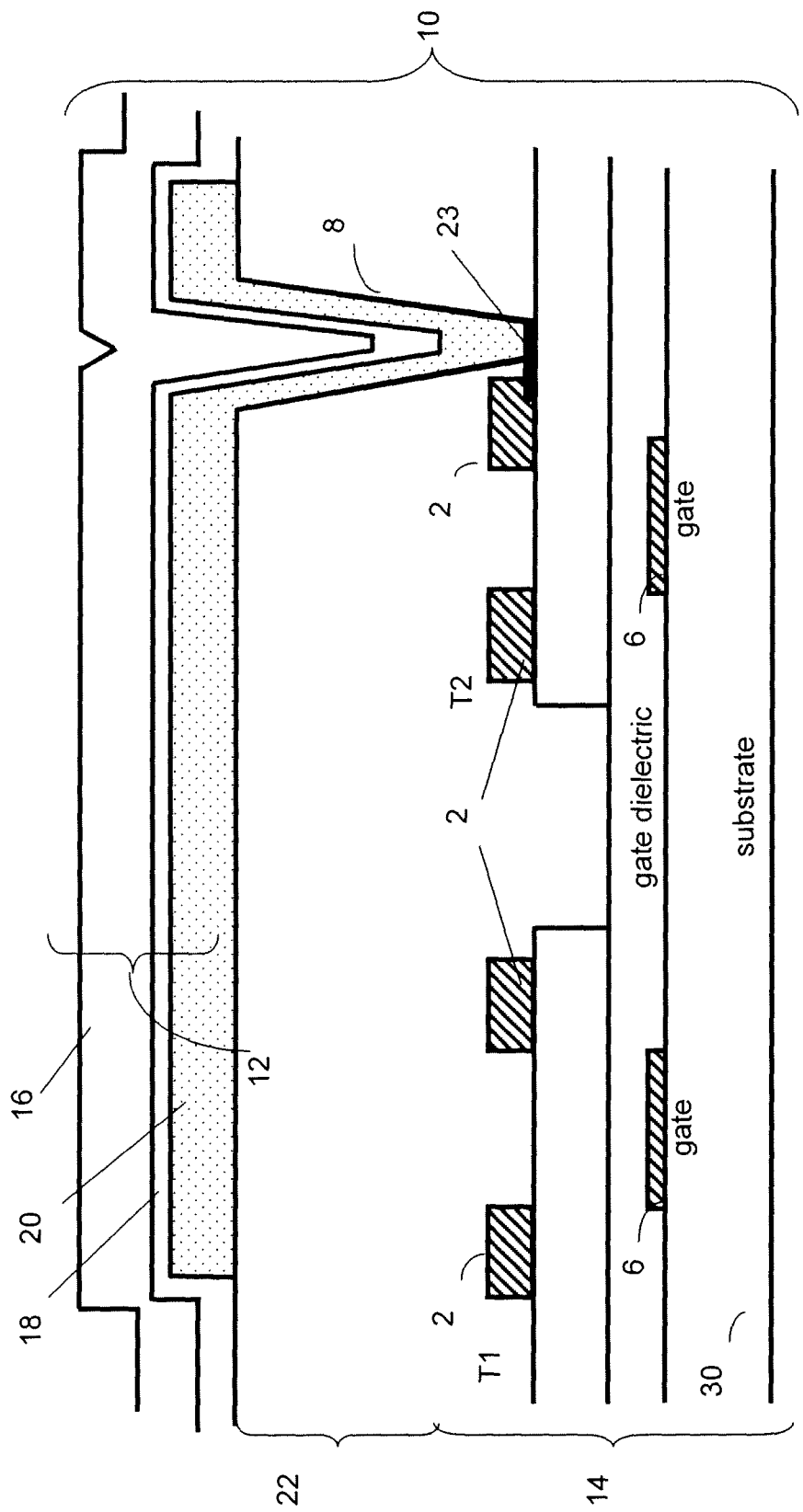
FIG. 9 is a schematic cross-section view showing an example of the pixel of FIG. 1, which incorporates a contact plate.

FIG. 9 shows another example of the pixel of FIG. 1. In FIG. 9, TFT source/drain metal overlaps a contact plate 23 made of thin and smooth conductive material, such as Cr, Mo or other. The contact plate 23 is formed by deposition and patterning of conductive films on the flat portion of pixel area. Preferably, the thickness of the contact plate 23 is between 50 and 150 nm.

The contact between the certain node of the TFT circuit, which is in the source/drain metallization layer of the TFT backplane 14, and the OLED bottom electrode 20 is made via the contact plate 23 rather than directly.

Depending on structure and fabrication method of the TFT backplane 14, the source-drain metal may have surface roughness well in excess of 1 nm. This may be the case if relatively thick metal layer, especially Al or Al-alloy, is used for source/drain metallization. Such a source-drain metallization can be required for the reasons associated with particular TFT fabrication process or display design. For example, highly conductive routing metallization is beneficial for reduction of power dissipation or better OLED brightness uniformity over the substrate area, especially if the display size is large. If such a source/drain metal would be in a direct contact with the bottom electrode of the OLED 20, its surface roughness is translated into the roughness of electrode 20 inside via area. This can make this area a source of shortages between OLED electrodes 20 and 16 and therefore cause OLED failure. Thus, in the pixel of FIG. 9, the contact to the bottom OLED electrode 20 is made via the smooth contact plate 23 formed in separate layer. In addition, if the TFT final metal (source/drain-metal) 2 is Al or Al-alloy or the like, and the bottom OLED electrode 20 is conductive oxide such as ITO, having a contact to the electrode 20 made of Cr, Mo or the like instead of Al/Al-alloy will reduce contact resistance, heat dissipation in the contact and improve overall contact reliability.

The contact plate 23 is formed before source/drain metallization of the TFT backplane 14. The TFT source drain-metal, which is formed next, has to overlap some portion of the contact plate 23 but leave a sufficient portion open for formation of via 8. In addition, it is desirable that source/drain metal can be selectively etched over contact plate metal. For example, if source/drain metal is Al or Al-alloy, using Cr for contact plate would provide excellent wet-etch selectivity. Roughness of the order 1 nm is easy to achieve with thin layers of metals such as Cr, Mo, Ti produced by sputtering, evaporation or other methods. Appropriate thin multi-layer metal coating can off cause be also used for contact plate 23.

After the TFT backplane 14 with the contact plate 23 is formed, further steps, application and patterning of the planarization dielectric layer 22, deposition and patterning of the bottom OLED electrode 20, deposition of the OLED layers 18 and OLED top electrode are performed in a manner described above.

Figure 10:
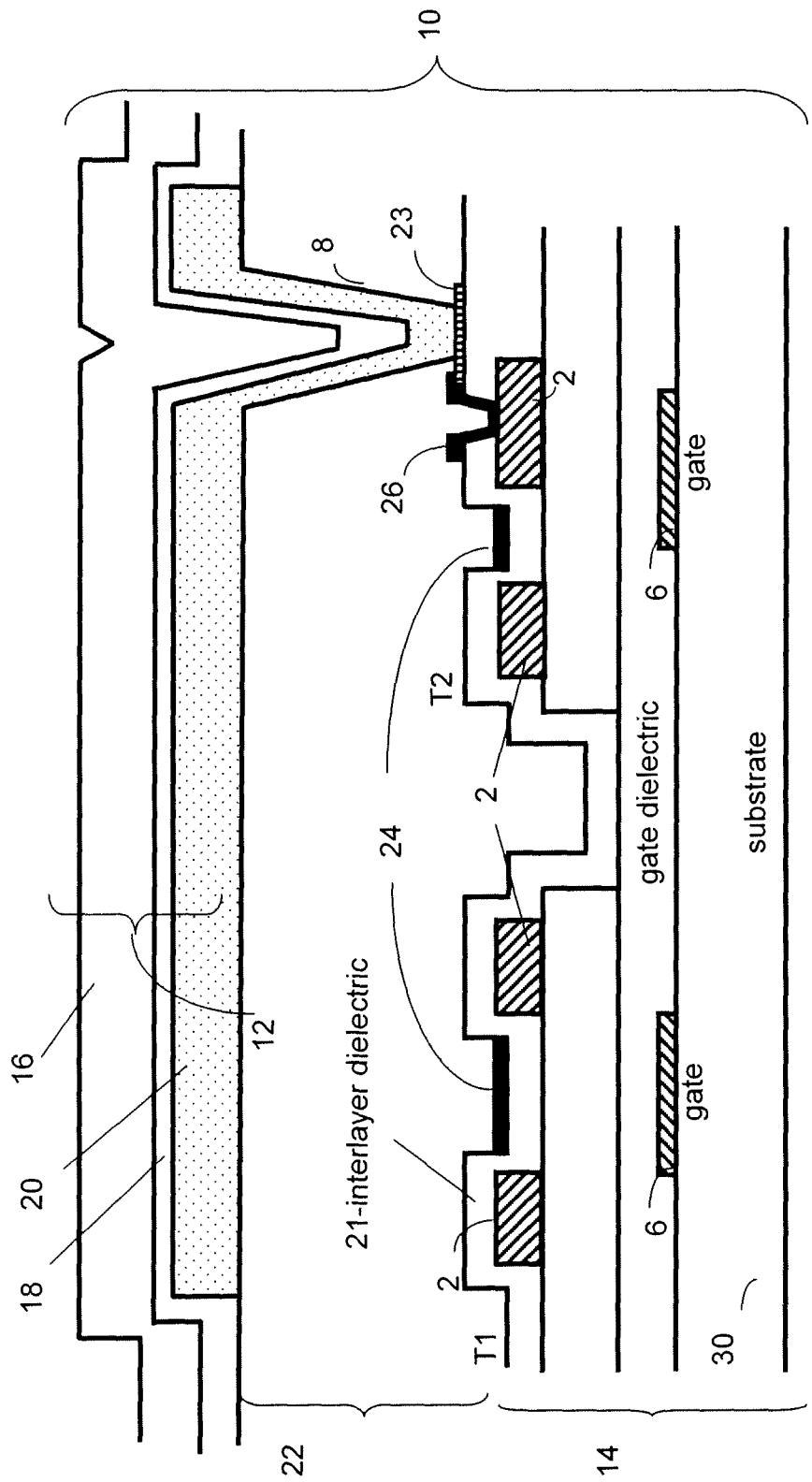
FIG. 10 is a schematic cross-section view showing an example of the pixel of FIG. 1, which incorporates a shield electrode and a contact plate.

FIG. 10 shows another example of the pixel of FIG. 1. In FIG. 10, the pixel has the shield electrode 24 and the contact plate 23. As described above, the shield 24 is formed to keep electric potential on the top of the TFTs at certain desired level. As the TFT backplane 14 is formed, the interlayer dielectric 21 is deposited. Then the contact plate 23 is formed of a thin and smooth metal layer such as Cr, Mo or the like on a flat portion of the pixel area. Preferably, the thickness of the contact plate 23 is between 50 and 150 nm. The vias in the dielectric 21 are patterned to provide interconnections between the source/drain and shield metallization levels where necessary. Then, shield metal is deposited and patterned to form the shield electrodes 24 and the interconnection plates 26. The interconnection plate 26 is to overlap the contact plate 23 but to leave its sufficient portion open, as shown schematically in FIG. 10. Preferably, the shield metal is selectively etched over the contact plate metal. As the TFT backplane 14 with the shield electrodes 24 and the contact plates 23 is formed, the planarization dielectric 22 is applied and though-via 8 is formed on the top of the portion of contact plate 23, which is free from shield metal (FIG. 10). Further steps (deposition and patterning of the bottom OLED electrode 20, deposition of the OLED layers 18 and OLED top electrode) may be performed in a similar manner as described above.

Figure 11:
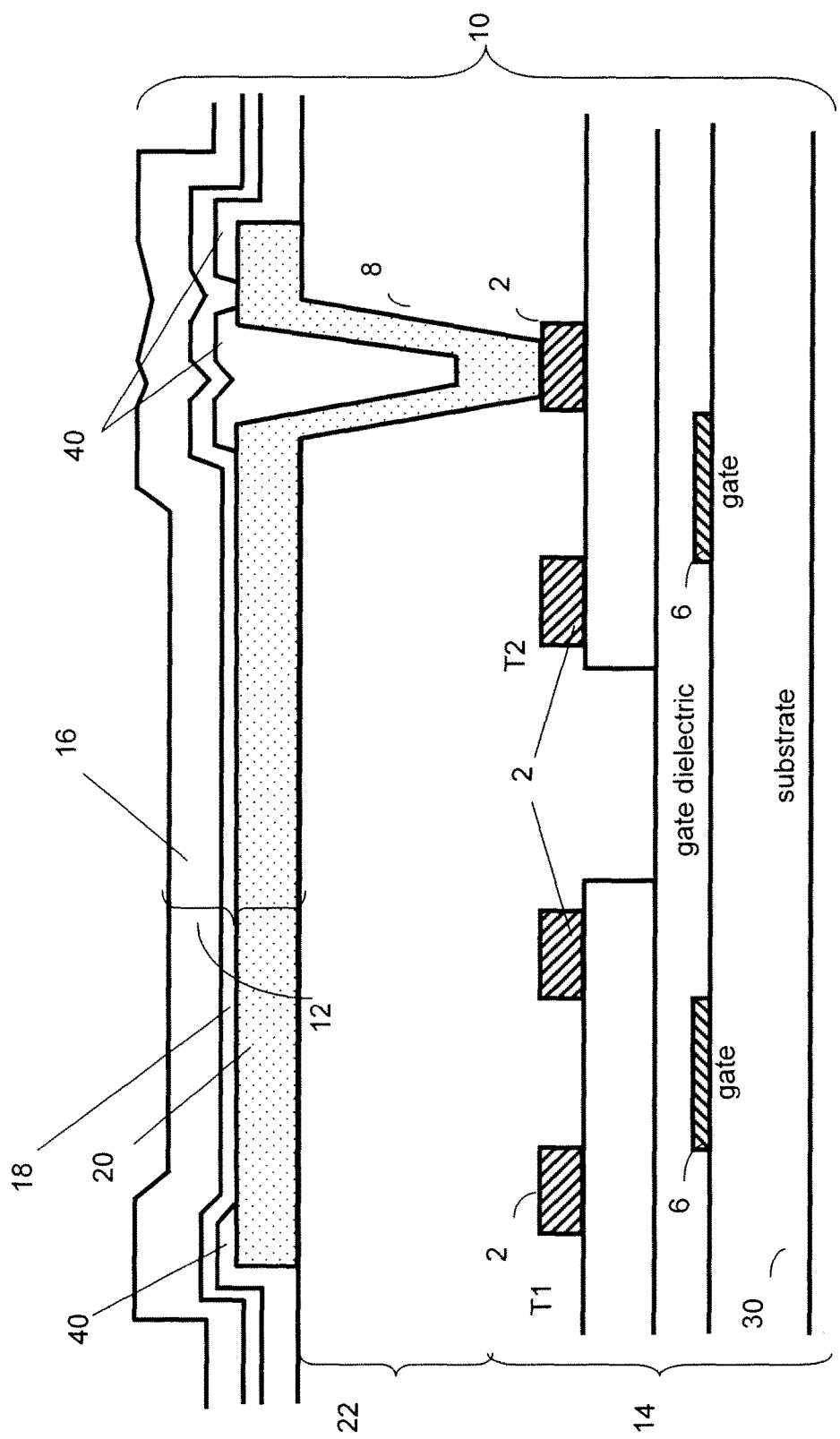
FIG. 11 is a schematic cross-section view showing a vertically integrated pixel in accordance with another embodiment of the present invention.
Figure 12:
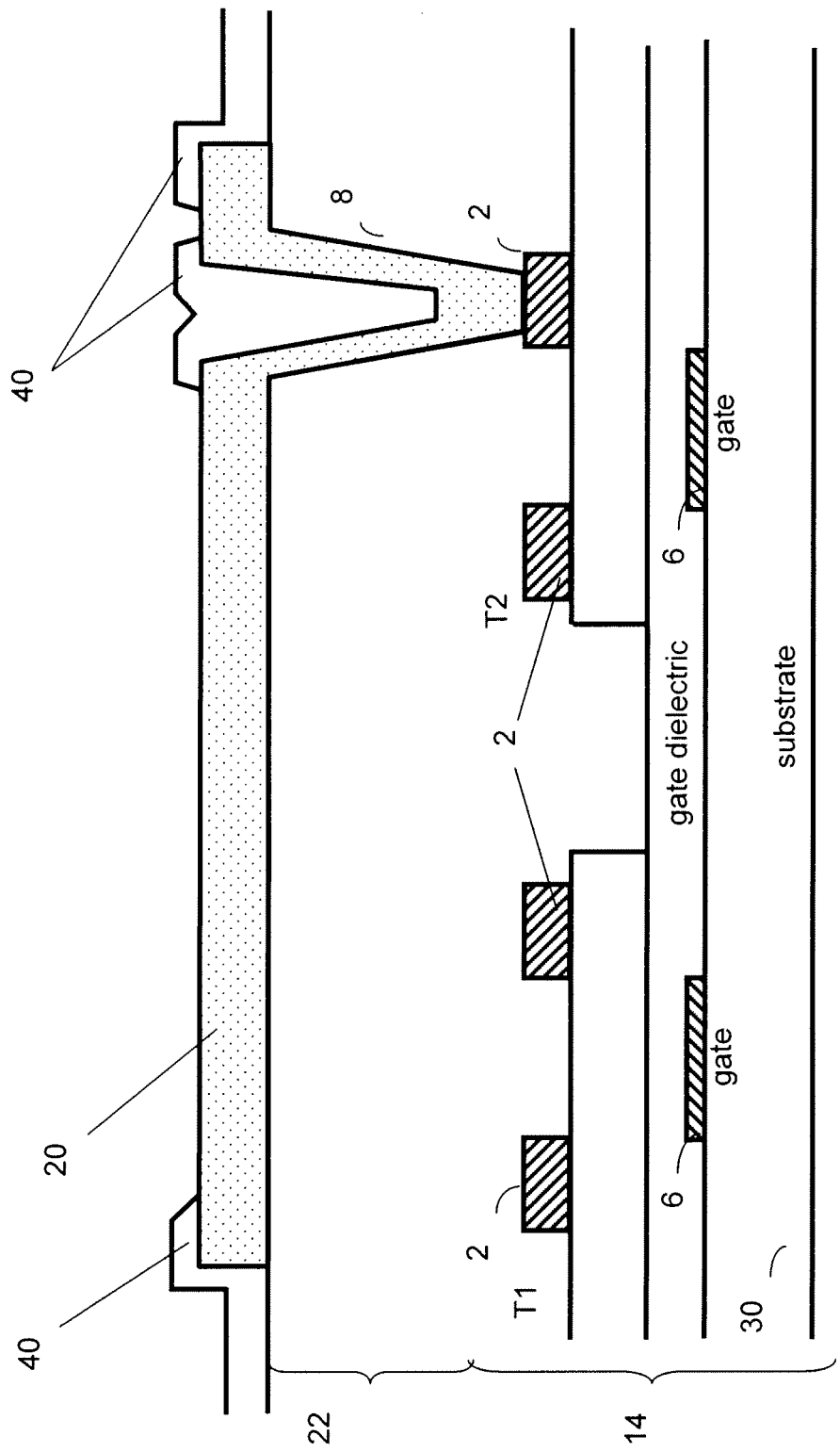
FIG. 12 is a schematic diagram showing fabricating process of the pixel of FIG. 11.

FIG. 11 shows a vertically integrated TFT-OLED pixel in accordance with another embodiment of the present invention. The dielectric layer 22 and the through-via profile of FIG. 11 are similar to those of FIG. 2.

The pixel 10 of FIG. 11 further includes an additional dielectric layer, i.e., dielectric cap 40, which is deposited on the top of the OLED bottom electrode 20. The dielectric cap 40 is patterned so as to cover the via area and the edges of the OLED bottom electrode pattern leaving the rest of the OLED bottom electrode 20 uncovered. The OLED layers 18 and the top electrode 16 are deposited in a similar manner as described above.

The dielectric cap 40 is provided to avoid breakage of continuously deposited OLED top electrode layers at the pixel edges, and therefore to prevent shortage of OLED devices. Further, the dielectric cap 40 insulates the via area, which, depending on the structure and fabrication method of the TFT backplane 14, may have higher surface roughness than the rest of the OLED bottom electrode 20 and may be therefore a source of the shortage of the OLED device.

The dielectric cap 40 is made of material, which may be either polymer dielectric (such as, BCB, polyimide, other polymer dielectric) or inorganic insulator (such as, silicon oxide, silicon nitride, silicon oxide-nitride).

The thickness of the polymer insulator may be from a few 100 nm to a few micron. With the polymer insulator, as shown above, the sidewall profile of the cap pattern can be made smooth enough to enable continuous coverage with the OLED layers 18 and OLED top electrode 16.

With inorganic insulator, the thickness of the dielectric cap 40 is adjusted in such a way to enable continuous coverage of the profile steps associated with the cap layer by the OLED top electrode 16. The thickness of an inorganic insulator can be between 50 and 500 nm (most preferably 50 to 200 nm). In addition, the conditions of dry or wet patterning of an inorganic insulator, such as silicon oxide or the like, can be adjusted to form the sloped sidewalls.

One example of the fabricating process for the pixel 10 of FIG. 11 is seen from FIGS. 6 to 8, 11 and 12. As the TFT backplane 14 is formed on the substrate 30 (FIG. 6), the planarization dielectric 22 is applied where the vias 8 with sloped sidewalls are opened to the source-drain metal 2 (FIG. 7). A conductive material is deposited and patterned to form the OLED bottom electrode 20 (FIG. 8). Then, the dielectric cap 40 is disposed as described above (FIG. 12). Then, the OLED layers 18 and the electrode are disposed and which completes the formation of the pixel structure shown in FIG. 11.

Figure 13:
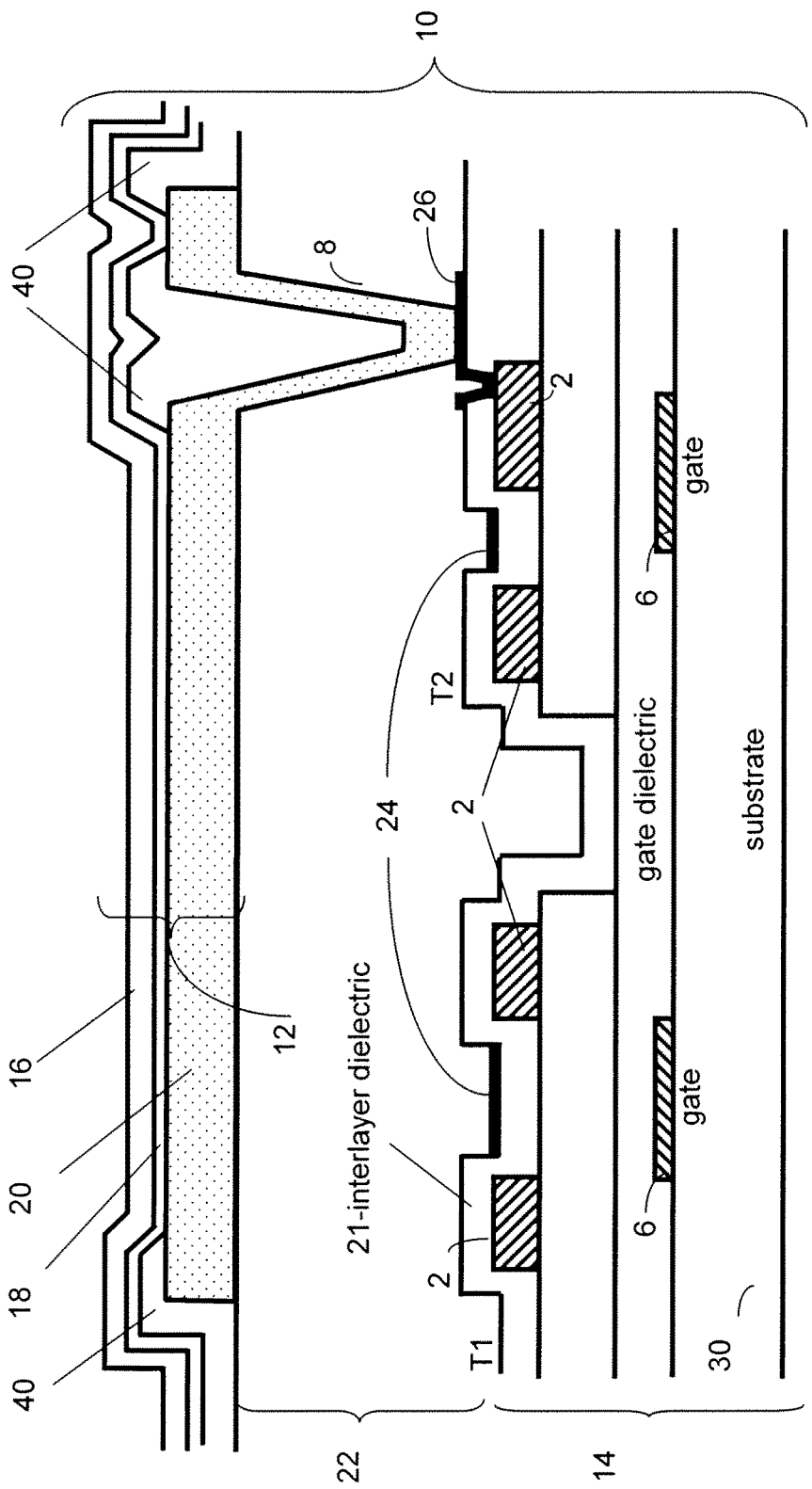
FIG. 13 is a schematic diagram of a vertically integrated pixel in accordance with another embodiment of the present invention.

FIG. 13 shows a vertically integrated pixel in accordance with another embodiment of the present invention. The pixel 10 in FIG. 13 includes the shield electrode 26 and the dielectric cap 40. First, the TFT backplane 14 is fabricated followed by deposition and patterning of the interlayer dielectric 21 and the shield electrode 24. The vias in the interlayer dielectric are formed to provide interconnection between the source/drain and interconnection plates 26 made in the shield metallization layer, where necessary. Next, shield metal is deposited and patterned to form the shield electrodes 24 and the interconnection plates 26. Next, the planarization dielectric 22 and the OLED bottom electrode 20 are deposited and patterned in a similar manner as described above. Then, the cap dielectric layer 40 is disposed and pattern as described in the previous embodiment. Finally, the OLED layers 18 and the OLED top electrode 16 are formed.

According to the embodiments of the present invention, the vertical pixel integration provides higher aperture ratio, which leads to: the possibility of using more advanced multi-transistor pixel driver circuit for improved display performance without taking up extra light-emitting area from the pixel; the possibility of using a TFT backplane, such as amorphous silicon, having lower mobility in contrast to poly-silicon, thereby simplifying the manufacturing process and reducing cost; and the reduction of current density through OLED providing higher operational stability and improved lifetime of the display device.

Further, the fabrication process sequences and critical processing details described above solve a variety of issues pertinent to vertical integration such as: smoothening out/planarizing vertical profiles in the dielectric layer 22 of the structures on the TFT substrate 14 to enable continuity of the OLED device layers 12; continuous sidewall coverage by pixel electrode material in the through-via profile in the dielectric 22; roughness of the order of 1 nm on the dielectric 22 and subsequent electrode layer, which enables successful OLED fabrication and to higher yield rate; and capping structure feature which do not comply to OLED fabrication process in terms of step height, sidewall angle and surface roughness by a dielectric layer. The via and edges of the electrode are covered with the dielectric cap 40.

While particular embodiments of the present invention have been shown and described, changes and modifications may be made to such embodiments without departing from the true scope of the invention which is defined in the claims.

What is claimed is:

1. A pixel having a vertical architecture, comprising:
an organic light emitting diode (OLED) device having a bottom electrode, one or more OLED layers and a transparent top electrode for emitting light;
a thin-film transistor (TFT) based backplane for electrically driving the OLED device, the TFT based backplane being vertically integrated with the OLED layers and located below said bottom electrode to form a top-emitting OLED, the TFT based backplane comprising:
source and drain nodes; and
a thin conductive contact plate formed entirely on a flat portion of the pixel area and electrically coupled to a source or drain node, the thin conductive contact plate defined by a top surface, a bottom surface, and side surfaces, its vertical dimension defined by the top and bottom surfaces substantially smaller than its horizontal dimensions defined by the side surfaces;
a planarization dielectric layer provided between the TFT based backplane and the OLED bottom electrode so as to planarize the vertical profile on the TFT based backplane, said planarization dielectric layer being in direct contact with both said TFT based backplane and said OLED bottom electrode;
a via in said planarization dielectric layer to provide a communication path between said TFT based backplane and said OLED device and through said thin conductive contact plate; and
a dielectric layer deposited on top of said bottom electrode and covering said via and all the edges of said bottom electrode while leaving the rest of said bottom electrode uncovered.

2. The pixel as claimed in claim 1, wherein the sidewall of said via in the planarization layer is sloped against the TFT based backplane.

3. The pixel as claimed in claim 2, wherein the TFT based backplane includes:
a substrate;
an interlayer dielectric layer on the source and drain nodes; and
an interconnection plate patterned on a via of the interlayer dielectric layer and being connected to the source or drain node and the thin conductive contact plate;
wherein the planarization dielectric layer planarizes the vertical profile on the substrate with the fabricated TFT based backplane, and the sloped via providing the communication path through the interconnection plate.

4. The pixel as claimed in claim 3, wherein the thin conductive contact plate is formed on a flat portion of the interlayer dielectric layer such that the interconnection plate overlaps a part of the contact plate.

5. The pixel as claimed in claim 3, further comprising a shield electrode disposed between the planarization dielectric layer and the interlayer dielectric layer, which is located separately from the interconnection plate.

6. The pixel as claimed in claim 2, wherein the TFT based backplane includes:
a substrate;
wherein the thin conductive contact plate is formed such that the source or drain material overlaps the thin conductive contact plate and the planarization dielectric layer planarizes the vertical profile on the substrate with the fabricated TFT based backplane.

7. The pixel as claimed in claim 6, further comprising a shield electrode formed separately from said thin conductive contact plate.

8. The pixel as claimed in claim 1, in which said dielectric layer is patterned in such a way that it insulates the OLED layers from the OLED bottom electrode at pixel edges and in and around the via while leaving the rest of the OLED bottom electrode in the direct contact with the OLED layers.

9. The pixel as claimed in claim 8, wherein said dielectric layer includes polymer dielectric or inorganic insulator.

10. The pixel as claimed in claim 8, wherein said dielectric layer includes material selected from the group from BCB, polyimide, polymer dielectric, silicon nitride and a thin film inorganic.

11. The pixel as claimed in claim 1, wherein the pixel has a roughness of the order of 1 nm on the planarization dielectric layer and subsequent electrode layer.

12. The pixel as claimed in claim 1, further comprising continuous sidewall coverage by pixel electrode material in the via profile in the planarization dielectric layer.

13. The pixel as claimed in claim 1, further comprising a shield electrode formed over the TFT.

14. The pixel as claimed in claim 1, wherein the planarization dielectric layer includes photosensitive benzocylobutene (BCB), the slope of the via being adjusted by the exposure time of the photosensitive BCB.

15. A method of fabricating a pixel, the pixel having an organic light emitting diode (OLED) bottom electrode, one or more OLED layers on the OLED bottom electrode, a transparent top electrode, and a thin-film transistor (TFT) based backplane for electrically driving the OLED and including a substrate, the method comprising the steps of:
providing the TFT based backplane on said substrate, including forming within the TFT based backplane a thin conductive contact plate entirely on a flat portion of the pixel area and electrically coupled to a source or drain node of the TFT based backplane, the thin conductive contact plate defined by a top surface, a bottom surface, and side surfaces, its vertical dimension defined by the top and bottom surfaces substantially smaller than its horizontal dimensions defined by the side surfaces;
providing a dielectric layer on the TFT based backplane, including the step of planarizing a vertical profile in the dielectric layer so as to planarize the vertical profile on the substrate with the TFT based backplane, said planarized dielectric layer being in direct contact with said TFT based backplane;
forming a via in said planarization dielectric layer to provide a communication path between said TFT based backplane and said OLED device and through said thin conductive contact plate;
depositing said OLED bottom electrode directly on top of said planarized dielectric layer and extending through said via into direct contact with said thin conductive contact plate of said TFT based backplane; and
depositing a dielectric layer on top of said bottom electrode and covering said via and all the edges of said bottom electrode while leaving the rest of said bottom electrode uncovered.

16. A method as claimed in claim 15, wherein forming said via which provides the communication path between the TFT backplane and the OLED device through the planarization dielectric layer, comprises forming the via such that the sidewall of the via in the planarization layer is sloped against the TFT based backplane.

17. A method as claimed in claim 15, wherein providing said dielectric layer between the OLED bottom electrode and the OLED layers, comprises patterning the dielectric layer in such a way that it insulates the OLED layers from the OLED bottom electrode at pixel edges and in and around the via while leaving the rest of the OLED bottom electrode in the direct contact with the OLED layers.

18. A method as claimed in claim 15, wherein the planarization dielectric layer including photosensitive benzocylobutene (BCB), further comprising the step of adjusting the exposure time of the photosensitive BCB such that the sidewall of the via in the planarization layer is sloped against the TFT based backplane.

19. A method as claimed in claim 15, wherein the pixel is formed such that the pixel has a roughness of the order of 1 nm on the planarization dielectric layer and subsequent electrode layer.

20. A method as claimed in claim 15, further comprising the step of providing continuous sidewall coverage by pixel electrode material in the via profile in the planarization dielectric layer.

21. A method of fabricating a pixel, the pixel having an organic light emitting diode (OLED) bottom electrode, one or more OLED layers on the OLED bottom electrode, and a thin-film transistor (TFT) based backplane for electrically driving the OLED and including a substrate, the method comprising the steps of:
providing the TFT based backplane on said substrate, including forming within the TFT based backplane a thin conductive contact plate entirely on a flat portion of the pixel area and electrically coupled to a source or drain node of the TFT based backplane, the thin conductive contact plate defined by a top surface, a bottom surface, and side surfaces, its vertical dimension defined by the top and bottom surfaces substantially smaller than its horizontal dimensions defined by the side surfaces;
providing a dielectric layer on the TFT based backplane, including the step of planarizing a vertical profile in the dielectric layer so as to planarize the vertical profile on the substrate with the TFT based backplane, said planarized dielectric layer being in direct contact with said TFT based backplane;
forming a via in said planarization dielectric layer to provide a communication path between said TFT based backplane and said OLED device and through said thin conductive contact plate;
depositing said OLED bottom electrode directly on top of said planarized dielectric layer and extending through said via into direct contact with said thin conductive contact plate of said TFT based backplane, and
depositing a dielectric layer on top of said bottom electrode and covering said via and all the edges of said bottom electrode while leaving the rest of said bottom electrode uncovered.

* * * * *